US011555494B2

(12) United States Patent
Peng et al.

(10) Patent No.: US 11,555,494 B2
(45) Date of Patent: Jan. 17, 2023

(54) OLDHAM COUPLING IN CO-ROTATING SCROLL COMPRESSORS

(71) Applicant: HITACHI-JOHNSON CONTROLS AIR CONDITIONING, INC., Tokyo (JP)

(72) Inventors: Jianhui Peng, Tokyo (JP); Fei Feng, Tokyo (JP); Gene Fields, Wichita, KS (US)

(73) Assignee: HITACHI-JOHNSON CONTROLS AIR CONDITIONING, INC., Tokyo (JP)

( * ) Notice: Subject to any disclaimer, the term of this patent is extended or adjusted under 35 U.S.C. 154(b) by 0 days.

(21) Appl. No.: 17/424,243

(22) PCT Filed: Apr. 8, 2019

(86) PCT No.: PCT/US2019/026250
§ 371 (c)(1),
(2) Date: Jul. 20, 2021

(87) PCT Pub. No.: WO2020/209827
PCT Pub. Date: Oct. 15, 2020

(65) Prior Publication Data
US 2022/0112896 A1  Apr. 14, 2022

(51) Int. Cl.
*F01C 1/02* (2006.01)
*F03C 2/00* (2006.01)
(Continued)

(52) U.S. Cl.
CPC .......... *F04C 18/023* (2013.01); *F01C 17/066* (2013.01); *F04C 29/0057* (2013.01);
(Continued)

(58) Field of Classification Search
CPC .. F04C 18/0215; F04C 18/023; F04C 23/008; F04C 29/0057; F01C 17/06; F01C 17/063; F01C 17/066; F16D 3/04
See application file for complete search history.

(56) References Cited

U.S. PATENT DOCUMENTS 4,178,143 A    12/1979  Thelene et al.
4,927,339 A *   5/1990  Riffe .................... F01C 17/066
                                                    418/55.3
(Continued)

FOREIGN PATENT DOCUMENTS

WO       2017/183615 A1    10/2017
WO    WO-2020050826 A1 *   3/2020 ............ F04C 18/023

OTHER PUBLICATIONS

International Search Report of PCT/US2019/026250 dated Jun. 24, 2019.

*Primary Examiner* — Theresa Trieu
(74) *Attorney, Agent, or Firm* — Mattingly & Malur, PC

(57) ABSTRACT

In some examples, a co-rotating scroll compressor includes a driver scroll having an axis aligned with the main axis and having a spiral involute, an idler scroll having an axis offset from the main axis and having a spiral involute intermeshed with the spiral involute of the driver scroll, and an Oldham coupling disposed between the driver scroll and idler scroll. The driver scroll may offset key slots so to engage with corresponding Oldham coupling keys. In another example, the Oldham coupling may offset driver scroll keys so to engage with corresponding key slots of the driver scroll.

17 Claims, 17 Drawing Sheets

(51) Int. Cl.
*F03C 4/00* (2006.01)
*F04C 18/00* (2006.01)
*F04C 18/02* (2006.01)
*G11C 7/10* (2006.01)
*H01L 27/108* (2006.01)
*G11C 11/409* (2006.01)
*G11C 7/22* (2006.01)
*F04C 29/00* (2006.01)
*F01C 17/06* (2006.01)
*F04C 23/00* (2006.01)

(52) U.S. Cl.
CPC ............ *G11C 7/1096* (2013.01); *G11C 7/222* (2013.01); *G11C 11/409* (2013.01); *H01L 27/108* (2013.01); *F04C 23/008* (2013.01)

(56) References Cited

U.S. PATENT DOCUMENTS

| | | | | |
|---|---|---|---|---|
| 5,037,280 A | * | 8/1991 | Nishida | F01C 17/066 |
| | | | | 418/55.3 |
| 5,090,876 A | * | 2/1992 | Hashizume | F01C 17/066 |
| | | | | 418/55.3 |
| 6,146,118 A | | 11/2000 | Haller et al. | |
| 6,494,695 B1 | | 12/2002 | Lifson | |
| 2005/0112011 A1 | | 5/2005 | Yamaji et al. | |
| 2019/0136693 A1 | * | 5/2019 | Yosuke | F01C 17/066 |

\* cited by examiner

OLDHAM COUPLING IN CO-ROTATING SCROLL COMPRESSORS

TECHNICAL FIELD

This disclosure relates to the technical field of co-rotating scroll compressors.

BACKGROUND

Scroll compressors are widely used in refrigerant compression applications including variable refrigerant flow (VRF) systems. A co-rotating scroll compressor includes a driver scroll and an idler scroll and both the driver and idler scroll involute sections on one side, but shaft sections on the opposite sides. The center of each involute is on the center of its respective shaft section. The driver scroll may have a long shaft, and the idler scroll may have a shorter shaft or bearing hub for a shaft. In some implementations, the driver scroll is in the center of the compressor, that is, it is aligned with the central axis or centerline of the compressor, and its rotation is powered by motor components including a rotor and a stator. The idler scroll may be positioned parallel, but an orbit radius (Ror) offset from the driver scroll. An Oldham coupling is disposed directly between the driver scroll land the idler scroll. In general, the driver scroll rotates the Oldham coupling, and the coupling then rotates the idler scroll. While both scrolls rotate, the relative motion between each is an orbiting motion.

Therefore, one involute will orbit with respect to the other involute.

SUMMARY

Some implementations include arrangements and techniques for a compressor, that may include a cylindrical housing, a lower cap housing engaging with the cylindrical housing, a main shaft disposed along a main axis, a driver scroll having a driver axis aligned with the main axis and having a spiral involute extending from a base plate of the driver scroll, an idler scroll having an axis offset from the main axis and having a spiral involute intermeshed with the spiral involute of the driver scroll, an Oldham coupling disposed between the driver scroll and idler scroll, and two key slots extending from the base plate of the driver scroll toward the idler scroll, each key slot respectively engages with a corresponding driver key of the Oldham coupling. A first plane through each of the two key slots is parallel to and offset from a second plane extending through the driver axis.

Other implementations include arrangements and techniques for a compressor, including a cylindrical housing, a lower cap housing engaging with the cylindrical housing, a main shaft disposed along a main axis, a driver scroll having a driver axis aligned with the main axis and having a spiral involute extending from a base plate of the driver scroll, an idler scroll having an axis offset from the main axis and having a spiral involute intermeshed with the spiral involute of the driver scroll, an Oldham coupling disposed between the driver scroll and idler scroll having two driver scroll keys. Further, a third plane through each of the two driver scroll keys is parallel to and offset from a fourth plane extending through a geometric center of the Oldham coupling.

BRIEF DESCRIPTION OF THE DRAWINGS

The detailed description is set forth with reference to the accompanying figures. The use of the same reference numbers in different figures indicates similar or identical items or features.

DESCRIPTION OF THE EMBODIMENTS

The respective involutes of the driver scroll and idler scroll fit together as an intermeshing pair of spiral involutes that form crescent shaped pockets of refrigerant gas during operation. In general, during compression, suction gas enters the compressor and then enters an outside area of the scroll pair. The pockets reduce in volume as the orbiting motion occurs, and this compresses the gas to a higher pressure. In some implementations, near the center section, the compression pockets reach a discharge port in the driver scroll and the high pressure gas exits through this port. In some implementations, the compressor is a "high pressure side" design, where suction gas enters directly into the compression chamber and most of the volume inside the compressor, is at discharge pressure.

In some examples, the axis of the idler scroll is mathematically offset from the axis of the driver scroll by a distance of the orbit radius of the scroll involutes. Of course, with radial compliance techniques, the position of the idler scroll axis can self-adjust within small increments. For the descriptions that follow, small increments may be neglected and the position of idler axis may be considered as constant. In general, the driver scroll rotates, and this motion is then transferred to the respective Oldham coupling keys, which in turn rotates the Oldham coupling. While the Oldham coupling rotates with the driver scroll, the Oldham coupling slides back and forth by its keys inside corresponding key slots of the driver scroll. Accordingly, the scroll keys of the Oldham coupling for the idler scroll then rotate the idler scroll in harmony with the driver scroll. This produces an orbiting motion of the Oldham coupling, with respect to the driver scroll, similar to the involute orbit motion. The two scroll involutes also orbit with respect to each other, and this produces the compression of gas.

In some examples of co-rotating scrolls, the Oldham coupling is disposed directly between the driver scroll and the idler scroll in order to ensure the smallest possible manufacturing error, since the critical features for alignment are produced at the same time. However, an Oldham coupling designed for direct alignment presents a challenge to avoid collision with inevitable structures between the driver scroll and the idler scroll. Examples of these are sections of the main bearing seat, outer sections of the scroll involutes, and the shoulder bolts 62 (described below).

In some implementations, the key slots and support extensions of the driver scroll may be shifted, which effectively moves or shifts the center mass of the Oldham coupling. Additionally, in some implementations, the keys of the Oldham coupling that engage with the key slots and the support extensions are moved or shifted away from a central plane of the Oldham coupling, which shifts or moves the center mass of the Oldham coupling.

Figure 1:
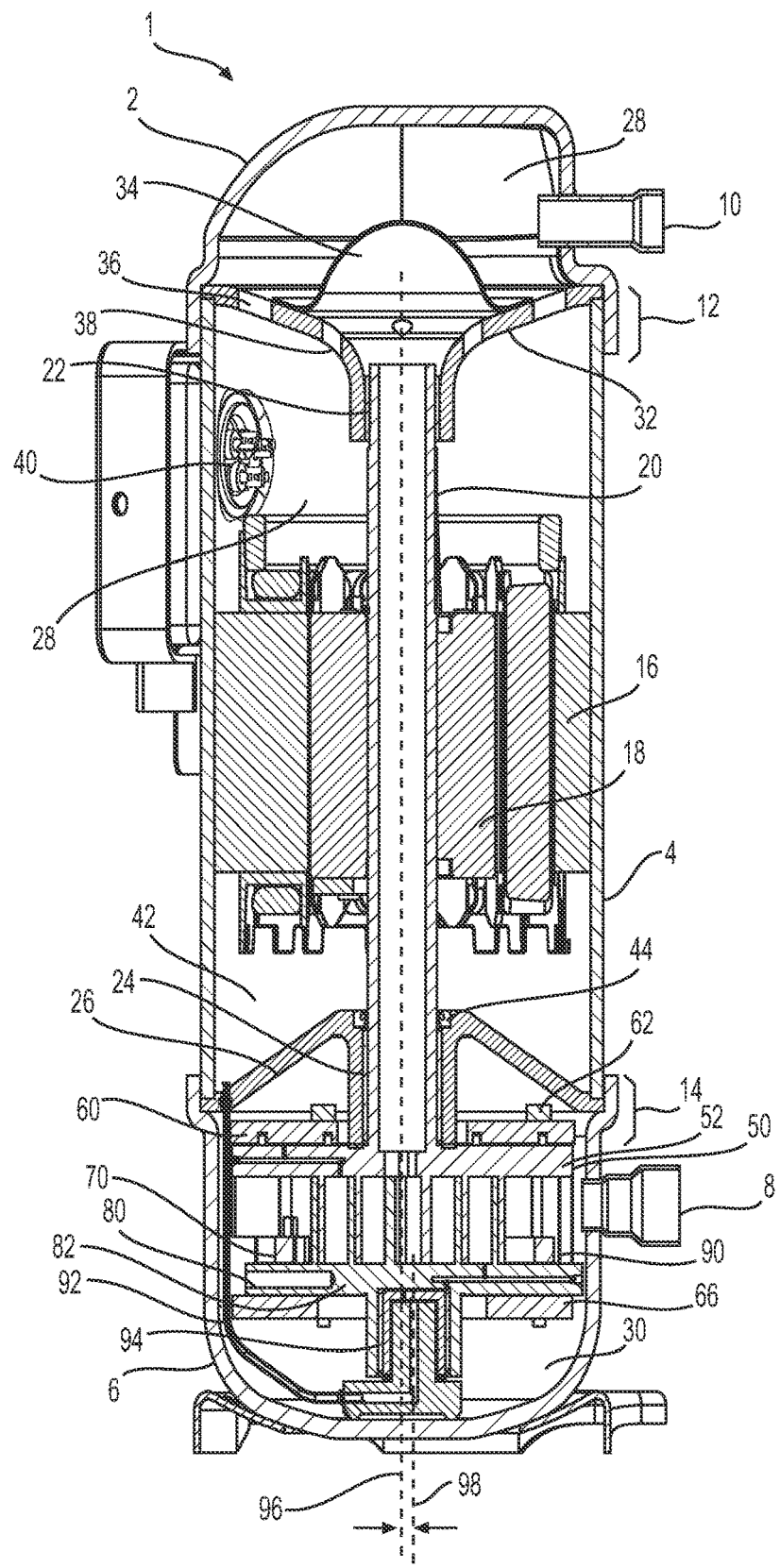
FIG. 1 illustrates an example of a cross-sectional view of a co-rotating scroll compressor according to some implementations.

FIG. 1 illustrates an example of a cross-sectional view of a co-rotating scroll compressor 1 according to some implementations. The body or housing of the compressor may include an upper cap 2, center shell 4, and lower cap or base 6. These components may be press fit together, as shown in portions 12 and 14. The upper cap 2, center shell 4, and lower cap 6 may have generally circular profiles. The lower cap 6 may essentially be bowl-shaped having vertical extending edges or rims that are essentially parallel to the main axis or centerline of driver scroll 96. The lower cap 6 may have an open end or face into which components of the compressor are assembled or disposed. The center shell 4 may essentially be cylindrical having an axis parallel to the main axis 96 and may be concentric to the bore(s) of the one or more bearings on the main shaft or driver scroll shaft 20, such as the main bearing 24 and/or a lower bearing or idler scroll bearing 94. The center shell 4 has open top and bottom ends and may be referred to as a "case." The upper cap 2 may essentially be a bowl-shaped having vertical edges or rims that are essentially parallel to the main axis 96. The lower cap 6 has an open end or face which houses components of the compressor once pressed in place during assembly that may include, for example, components of the compression mechanism or compression unit, such as the driver scroll 50 and the idler scroll 80 and associated components. The center shell 4 may be sheet metal or steel tubing or the like. The upper cap 2, center shell 4, and lower cap 6 may be made of low carbon steel. Further the scroll compressor 1 may be hermetically sealed from the ambient surroundings, but the techniques described herein may also be applied to a semi-hermetic scroll design, without loss in performance. As shown, a hermetic terminal 40 may be disposed in the center shell 4 or alternatively in the upper cap 2.

In some implementations, the entire compressor chamber above the main bearing seat 26, such as the high chamber 28, contains high-pressure discharge gas, the motor components (e.g., motor stator 16 and motor rotor 18), and the upper bearing 22 assembly. This chamber may also contain the oil sump or reservoir 42, which may essentially be between the main bearing seat 26 and the motor components. The chamber below the main bearing seat 26 may contain the low pressure suction gas, the compression mechanisms (e.g., driver scroll 50 and idler scroll 80) one or more of the radial compliance features (e.g., the shaft pin with a drive flat at an angle of $\Theta$, with respect to the idler scroll coordinate axis, the corresponding slider block 264, and the idler scroll bearing 94 and hub 260 (described below)), and some of the oil in the compressor due to natural leakage through the bearings.

Further, an upper bearing plate 32 may be disposed with a portion around the upper bearing 22 and fanning upward and out toward the upper cap 2. A suction inlet 8 may be disposed in the lower cap 6 to suction a refrigerant gas or a mixture of liquid and gas and a discharge outlet 10 may be disposed in an upper cap 2. In the example shown in FIG. 1 the refrigerant is suctioned directly into the compression chamber formed by the intermeshing of involutes of the driver scroll 50 and idler scroll 80, and most of the interior of the housing may be at a discharge pressure.

A driver scroll shaft or main shaft 20 is aligned with the main axis 96 and as mentioned above may be supported by at least a main bearing 24 and the upper bearing 22, such that the main axis 96 may be rotated up to very high speeds by the rotor 18, operating inside stator 16. The lower bearing or idler scroll bearing 94 may be disposed inside a hub section of the idler scroll 80. Further, the main bearing seat 26 may be press fit inside center shell 4. Since the main bearing 24 is concentric with the main bearing seat diameter, the driver scroll/main shaft 20 will then be aligned concentrically with the stator 16. Upon operation, the stator 16 imparts a magnetic field such that the rotor 18 will spin in the appropriate direction and produce high power for compressing the gas in the compression unit, e.g., compression pockets of gas formed by the intermeshing of the spiral involute of the driver scroll 50 and the spiral involute of the idler scroll 80 upon operation. In some implementations, the motor (e.g., rotor 18 and stator 16) may contain a special winding design for the stator 16, as well as a rotor 18 with permanent magnets.

As shown in FIG. 1 and discussed in further detail below, a seal plate 60 may be disposed on top of a first surface of the driver scroll plate 52 in some implementations. An Oldham coupling 70 may be disposed between the driver scroll 50 and the idler scroll 80 and a thrust plate 66 may be disposed below the idler scroll plate 82 in some implementations. Further, in some examples, the seal plate 60 is attached to the thrust plate 66 by one or more bolts 62 (e.g., 4 equally spaced shoulder blots). Additionally, the compressor 1 may include an oil supply tube 92 that supplies discharge pressure oil from the high pressure side above the main bearing seat 26.

Figure 2:
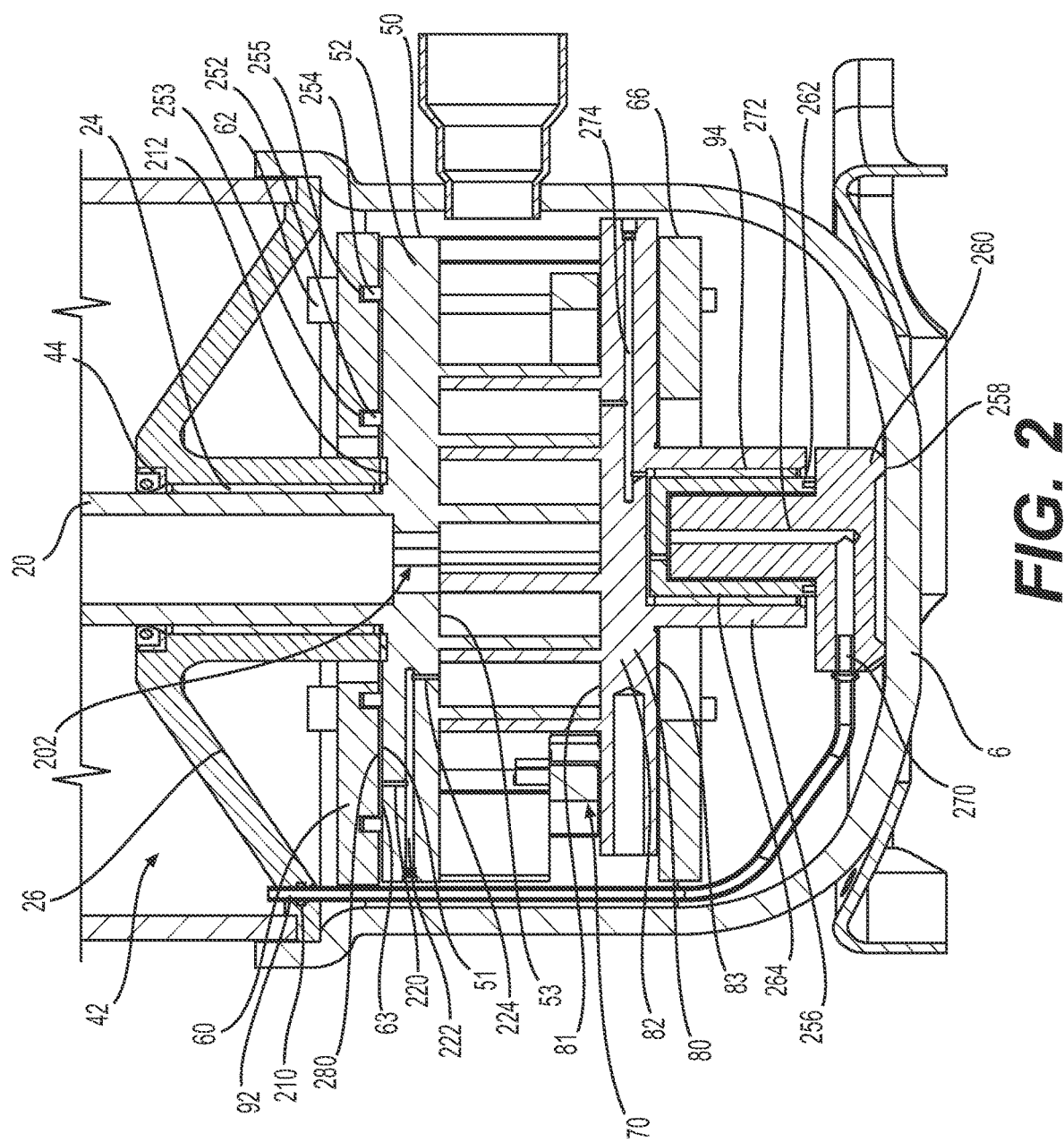
FIG. 2 illustrates an example of a lower portion of a cross-sectional view of a scroll compressor according to some implementations.

FIG. 2 illustrates an example of a lower portion of a cross-sectional view of a scroll compressor according to some implementations. As shown in FIG. 2, the compression mechanisms, which may include the driver scroll 50 and the idler scroll 80 are disposed below the main bearing seat 26. The driver scroll 50 includes a spiral involute extending downward from a lower surface or bottom surface 53 of the driver scroll plate 52. The spiral involute of the idler scroll 80 extend upwards from an upper surface or top surface 81 of the idler scroll plate 82 to intermesh with the involute of the driver scroll 50. As mentioned, the driver scroll 50 axis is on the main axis 96 of the compressor and in some implementations is aligned with at least the upper bearing 22, stator 16, rotor, 18 and main bearing 24. According to some examples, the idler scroll 80 axis is offset 98 from the main axis 96 (as shown in FIG. 1) and may be disposed at a distance equal to the orbit radius (Ror) of the two involutes.

A discharge port or hole 202 may be disposed in the driver scroll 50 for discharging compressed gas. A main bearing 24 may be disposed concentrically on the driver scroll 50 and in between the main bearing seat 26 and the driver scroll shaft 20. In some implementations, the main bearing 24 is disposed below the shaft seal 44 and above a thrust washer 212. In some implementations, the driver scroll 50 load is primarily carried by the main bearing 24. The thrust washer 212 may be disposed between the driver scroll plate 52 and the main bearing seat 26. Further, the main bearing 24 may be pressed into the main bearing seat 26 and the driver scroll shaft 20 rotates within the main bearing 26.

In some implementations and as shown in FIG. 2, an Oldham coupling 70 may be disposed directly between the driver scroll 50 and the idler scroll 80 and may rest on the idler scroll plate 82, such as on the upper surface 81. The keys of the Oldham coupling 70 are engaged between the driver scroll 50 and the idler scroll 80. In general, as the driver shaft 20 rotates, the driver scroll 50 rotates the Oldham coupling 70, and the Oldham coupling 70 then rotates the idler scroll 80. The Oldham 70 coupling transfers motion from the driver scroll 50 to the idler scroll 80. Accordingly, during operation, while the driver scroll 50 and the idler scrolls 80 rotate, the relative motion between each is a circular orbiting motion. Therefore, during operation one involute will orbit with respect to the other involute.

In some implementations, the idler scroll 80 includes an idler scroll hub 256 that extends in a downward direction from a lower surface or bottom surface 83 of the idler scroll plate 82. The idler scroll hub 256 may be disposed around the idler scroll bearing 94. Further, the idler scroll hub 256 and the idler scroll bearing 94 may be aligned with the idler scroll axis offset 98, through the idler scroll shaft 260 and the slider block 264. In some implementations, the idler scroll 80 load is primarily carried by the idler scroll bearing 94 and the idler scroll bearing 94 may be pressed into the idler scroll hub 256 and rotates around the essentially stationary slider block 264. The slider block 264 serves as a compliant shaft journal and has a drive flat that is positioned with respect to an idler axis coordinate, at a drive angle Θ, which effectively adds adequate flank contact force from the Ftg (tangential gas) vector to minimize leakage.

Further, he idler scroll bearing 94 and a crown on the slider block 264 drive flat may be lubricated with oil. The slider block 264, in some implementations may be a sintered, hardened, and ground component, which forms a journal for the idler scroll bearing 94.

FIG. 2 further shows that in some examples, an idler shaft hub 260 may be welded, by resistance welding, for example, to the lower cap 6 and may have one or more protrusions extending downward to be welded. The idler scroll hub 256, slider block 264, and idler scroll bearing 94 are each essentially aligned with the idler shaft hub 260. These components "self align," to the idler scroll axis offset of FIG. 1. While the offset is essentially a calculated value, based on the scroll involute geometry, the actual value will be established by the radial compliance mechanism, which will be described in detail.

A slider block seal 262 may be disposed at a lower portion of the slider block 264 and may form a seal at an upper surface of the base portion of the idler shaft hub 260. The slider block seal 262 may control an amount of oil that passes into the low side of the compressor as well as define a stabilizing load of the slider block 264 against the idler shaft hub 260.

Further, in some implementations, a lubricant such as oil may be supplied to the lower portion of the compressor by an oil supply tube 92 that may be sealed 210 into the main bearing seat 26 and/or sealed into the idler shaft hub 260. According to some implementations, discharge pressure oil may be supplied underneath the idler scroll hub 256 or shaft; such that the shaft 256 or hub becomes similar to a rotating piston. This is because the idler shaft hub 260 and the slider block 264 are essentially a non-rotating piston, and the idler scroll bearing 94 and idler scroll hub 256 are essentially a rotating cylinder for the stationary piston. In some implementations, both the driver scroll 50 and the idler scroll 80 have oil pressurized by discharge pressure applied to them, except the driver scroll force will always have discharge pressure gas v. the idler with discharge pressure oil. Therefore, this implementation is to apply the optimum axial gas force to control the scroll compression, as well as effectively cancel the downward force of the driver scroll. The oil supply tube 92 is one example for conveying the pressurized oil.

FIG. 2 further shows one or more oil injection paths 274 of idler scroll plate 82, which are explained in more detail below. With respect to axial compliance, because the driver scroll shaft 20 is located in the high pressure side of the compressor, a downward force of discharge pressure (Pd) times the area of the shaft 20 diameter is produced. Therefore, the diameter of the driver scroll shaft 20 is important to the axial compliant force, as well as the strength and deflection considerations. The discharge pressure force component for axial compliance may be accomplished by specifying the diameter of the driver scroll shaft 20. The diameter of the driver scroll shaft is selected for optimum load carrying capability as well as the associated journal bearing, and the adequate hydrodynamic oil film. Therefore, effect of piston diameter on discharge pressure force is essentially a result of the shaft bearing selection. For example, a shaft 20 diameter of 28 mm for a compressor capability of 10 hp. It should be noted that essentially all axial compliant scroll designs contain a force produced by discharge pressure x area, as well as a force produced by (compressed suction) intermediate pressure x a different area. These two forces are then optimized for all operating conditions. Additionally, in an attempt to maintain axial compliance, some implementations may include a seal plate 60 which will contain compressed suction intermediate gas pressure, disposed above a top surface or upper surface 51 of the driver scroll plate 52, in the low side chamber. The seal plate 60 may have one or more annual grooves 253, 255 in which corresponding inner seal 252 and outer seal 254 may engage with to form a sealed chamber during operation. In some examples, the grooves or channels may be disposed in the top surface 51 of the driver scroll plate 52. Additionally, in some examples, the inner seal 252 and/or the outer seal 254 may be fixed to the surface of the driver scroll plate. In some instances, the seal plate 60 may be attached to a thrust plate 66, by one or more bolts 62 and in some examples four equally-spaced bolts 62 are disposed. The body of a bolt 62 may be a precision ground diameter and length. Further, the bolts 62 may be equally spaced in precise positions, and these are carried downward through the driver scroll plate 52 and rigidly into the thrust plate 66. In some examples, the bolts 62 have a precision slip fit through the seal plate 60, as well as the driver scroll plate 52. In some examples, the compressor may not include the thrust plate 66 and/or the seal plate 60.

Further, in some examples, between the seal plate 60 and the top surface or upper surface 51 of the driver scroll base plate 52, there is a specific clearance 280 and this may be accounted for in the overall length of the bolts 62. Additionally, there may be a specific clearance 280 between the top surfaces of the driver scroll plate 51 and the bottom surface of the seal plate 63 and this clearance may depend on the length of the bolts 62. This clearance is required such that the seals 252, 254 can extend upward and make contact between the driver scroll plate 52 and the seal plate 60, and the differential pressure across the respective seals 252, 254 causes this to occur. Further, there may be a clearance or gap between the top surface of the respective seals 252, 254 and the bottom surface of the respective grooves 253, 255 that the top surface of the seals 252, 254 face. Depending on the type of seals, the clearance could be from 120-200 micron. In some implementations, the pressure between the inner seal 252 and outer seal 254 is less than the discharge pressure. Further, in other examples, the inner seal 252 and outer seal 254 may be a spring loaded face-type. During compression, a back chamber force may be produced between the inner seal 252 and outer seal 254 of the seal plate 60 and the gas pressure inside the back chamber is higher than outside of an area between the inner seal 252 and outer seal 254, which is suction pressure Ps.

In some implementations, a thrust plate 66 may be disposed concentric with the driver scroll axis 96. The thrust plate 66 may be disposed underneath the lower surface or bottom surface 83 of the idler scroll plate 82. Further, corresponding holes for the one or more bolts 62 are disposed in the thrust plate 66, which are described in more detail below. In general, the thrust plate 66 may rotate around the driver scroll axis 20, and the idler scroll 80 on its own axis. The driver scroll plate 52 may further include one or more radial and horizontal passages (e.g., passages 220, 222, 224) for compressed suction gas, for example. Additionally, the idler scroll 80 may be loaded against and orbit directly between the top of the thrust plate 66 and the involute floor surface of the driver scroll 50.

Figure 3:
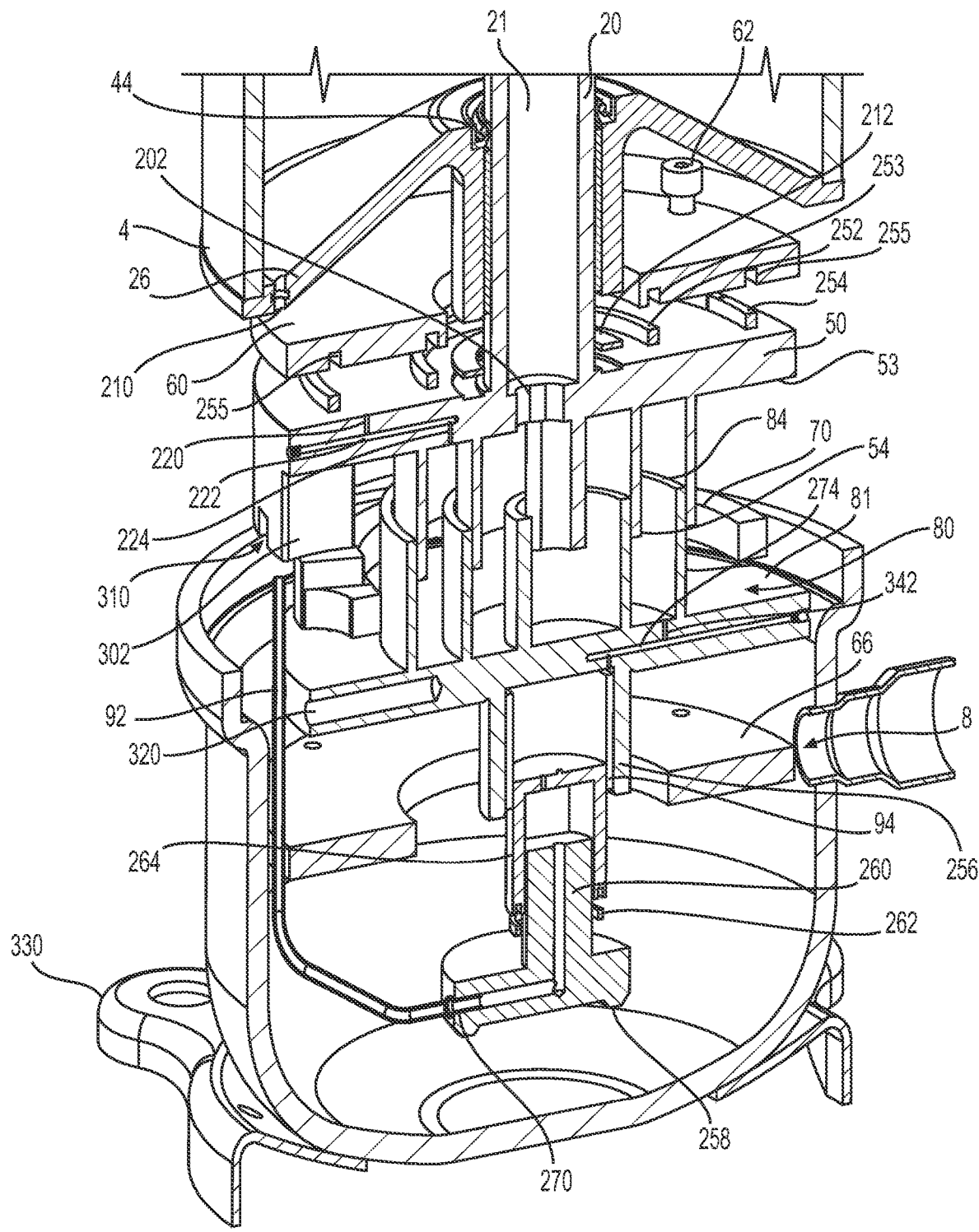
FIG. 3 illustrates an example of a lower portion of a scroll compressor in an isometric view of a cross-section according to some implementations.

FIG. 3 illustrates an example of a lower portion of a scroll compressor in an isometric view of a cross-section according to some implementations. As mentioned, one or more passages (e.g., passages 220, 222, 224 for compressed suction gas passages may be disposed in the driver scroll base plate 52 and these passages may be a hole or other cavity drilled or otherwise created in the driver scroll plate 52. The passages may open to each other or otherwise intersect to create a flow of gas under pressure through the driver scroll plate 52. FIG. 3 also shows an exit passage or hole 21 in the driver scroll 50. In some implementations, a hole 320 may be drilled or otherwise created radially in the idler scroll plate 82 to balance the idler scroll 80. This hole may be plugged. Additionally, as shown in FIG. 3, a mounting portion or base 330 may be attached to the lower cap 6.

For example, the passages in the driver scroll base plate 52 may include a first radial passage 222, a first axial passage 220, and a second axial passage 224. The first radial passage 222 may have a radius greater than the respective radii of the axial passages 220, 224 in the driver scroll plate 52. Also, the outer radial extent of the first radial passage 222 may be plugged with a plug 221.

A first axial passage 220 may intersect with the first radial passage 222 at one opening and may be disposed between the inner seal 252 and outer seal 254. That is, the other opening of the first axial passage 220 may open between the inner seal 252 and outer seal 254.

Further, a second axial passage 224 that intersects with the first radial passage 222 may be disposed inward of the first radial passage 222 in the radial direction. That is, one opening of the second axial passage 224 may open and intersect with the first radial passage 222 and the other opening of the second axial passage 224 may open into the floor between involute walls of the driver scroll 50 involute. During operation, this opening allows compressed suction gas source to be supplied and the position of this opening should be precise within the involute geometry to obtain the required pressure. During operation, the corresponding involute of the idler scroll 50 passes back and forth over this hole or opening, opening to different pressures in each pocket. For this reason, the diameter of this hole is small (small compared to the other opening of this passage. In some implementations, the first radial passage 222 may be 3 mm, the second axial passage 224 may be 0.7 mm, and the first axial passage 220 into seal chamber may be 2 mm. The hole or opening of the first axial passage 222 that is between the inner seal 252 and outer seal 254 is may be less than the opening to the compression pocket of the second axial passage 224, to minimize the transient back flow.

For example, the source of compressed suction gas enters second axial passage 224. This gas cycles from low to high pressure, as the compression involute pockets actually orbit. The second axial passage 224 starts out at the lowest pressure in a pocket, then increases to the highest pressure, before the adjacent involute wall of the driver scroll 50 passes over the second axial passage 224. Then a new low pressure enters the second axial passage 224. The diameter of first axial passage 220 is essentially very small, and this greatly limits the sinusoidal pressure variation inside the compressed suction gas chamber. It essentially averages the high and low pressure variation.

In some implementations, the driver scroll plate 52 includes two Oldham key support extensions 302 spaced equally apart around the driver scroll plate 52 and extending downward from the bottom surface or lower surface 53 of the driver scroll plate 52. The Oldham key support extensions 302 enable the Oldham coupling 70 to fit between the scrolls, and directly engage each scroll base plate to rotate in near perfect alignment. The Oldham key support extensions 302 may not extend downward from the second lower surface or bottom surface 53 of the driver scroll base plate as much as the involute extends downward. Further, the outer face of the Oldham key support extension 302 may be flush with an outer surface of the driver scroll plate 52. Disposed within each key support extension 302 is a key slot 310 for engaging with a driver scroll key (described below) of the Oldham coupling 70 having a corresponding shape to the key slot 310. Additionally, there is adequate clearance between the inner face of the key support extension 302 and the outer wall of the involute. The key slot 310 may include two side surfaces which may be flat and parallel to one another.

As shown in FIG. 3, the seal plate 60 may have an outer annular groove or channel 255 and inner annular groove or channel 253 disposed in a bottom or lower surface of the seal plate 60. The outer groove 255 and inner groove 253 may correspond with the outer seal 254 and inner seal 252, respectively. According to some examples, the outer seal 254 and inner seal 252 are annular protrusions, extensions, or ridges protruding from the top surface or upper surface 51 of the driver scroll plate 52. In some implementations, the outer seal 254 and inner seal 252 are static. That is, there may not be spinning or orbiting motion between the seals and the sealing surface.

Figure 4:
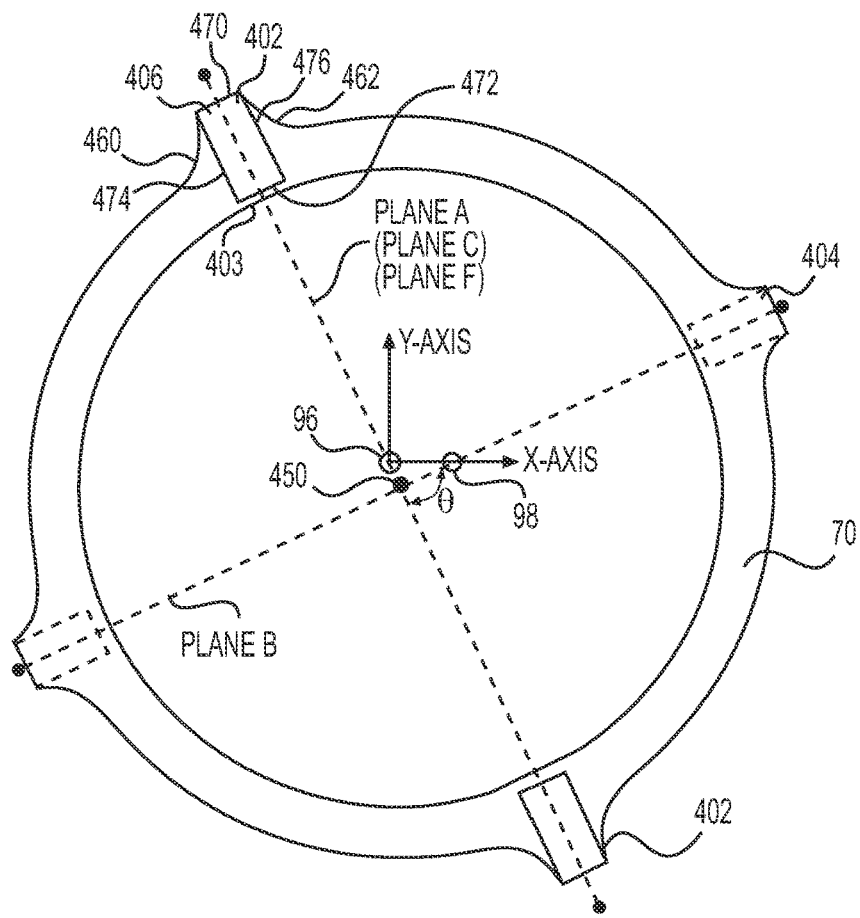
FIG. 4 illustrates an example of a top view of an example of an Oldham coupling according to some implementations.
Figure 5:
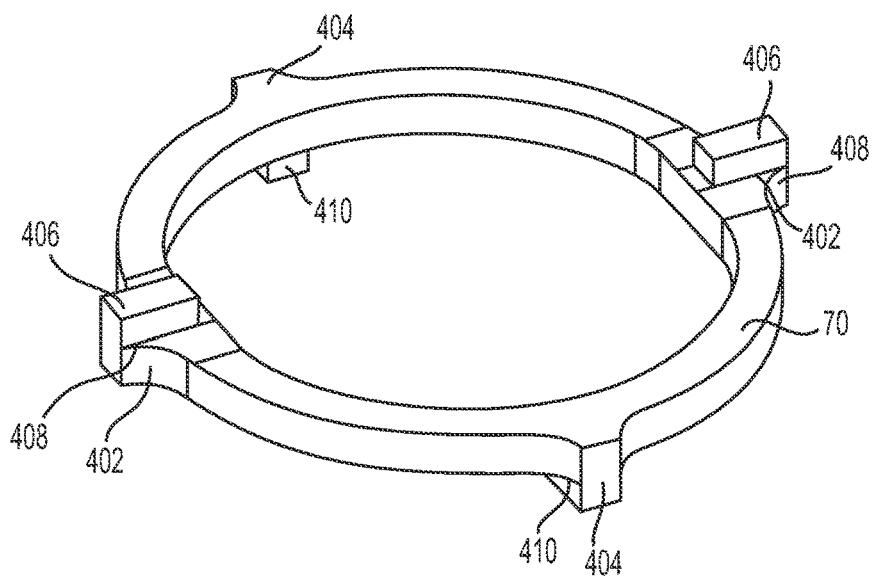
FIG. 5 illustrates an example of an isolated view of an example of an Oldham coupling according to some implementations.

FIG. 4 illustrates an example of a top view of an example of an Oldham coupling according to some implementations. FIG. 5 illustrates an example of a perspective view of an example of an Oldham coupling according to some implementations. In some implementations, the Oldham coupling 70 includes driver scroll keys 402 each having a portion 406 extending upward in the axial direction from a top surface of a base portion 408 that extends outward from the outer surface of the Oldham coupling 70 in the radial direction. As shown, the portions 406, 408 may have a shape corresponding to the Oldham key slot 310 in an Oldham key support extension 302 of the driver scroll plate 52. The curved portion 460 of the outer surface of the Oldham coupling 70 may be symmetrical to the curved portion 462 in slope and shape. Further, the raised or elevated portion 406 of the driver scroll key 402 may have a rectangular prism or cuboid shape with an inward facing surface 472 parallel to an outward facing surface 470. Side surfaces 474, 476 of the elevated portion 406 may be flat and parallel to one another. Additionally, a plane coincident with the inner surface 472 may be parallel with a tangential plane of a curved portion 403 of the inside surface of the Oldham coupling 70. Of course, as mentioned, the shape of the raised or elevated portion 406 will correspond to the key slot 310 formed in part by the support extensions 302.

Additionally, in some implementations, one or more idler scroll keys 404 may be disposed each having a portion 410 extending downward from a portion extending outward in the radial direction from the outer surface thereof. The portions 404, 410 may have a shape corresponding to the idler scroll Oldham key slots of the idler scroll plate 82 (not shown for the sake of brevity).

The Oldham coupling 70 may be produced as die cast aluminum, followed by machining the necessary surfaces for operation contacting. As mentioned above, the Oldham coupling 70 essentially maintains the involute coordinate axis between the orbiting and fixed scroll involutes. Upon operation, for example, the driver scroll 50 rotates and this motion is then transferred to the respective Oldham keys, which in turn rotates the Oldham coupling 70. While it rotates with the driver scroll 50, there is an orbiting motion of the Oldham coupling 70, the same as with the involute orbit motion. From this point, the idler scroll keys then rotate the idler scroll 80 in harmony with the driver scroll 50. This produces an orbiting motion of the Oldham coupling 70. For example, the relative motion of the Oldham with respect to each of the two scroll members may simply be the Oldham keys (402, 404) sliding back and forth in each scroll member's key slot (e.g., key slot of the driver scroll 310).

In FIG. 4, for example: Plane A (third plane) passes through the center of the driver scroll keys 402; Plane B pass through the center of the idler scroll keys 404; Plane F (second plane) passes through the driver scroll axis 96, and is parallel to Plane A; Plane F is a stationary reference for the parameters that move during the compression process (and may not always be aligned to Plane A); and Plane C (fourth plane) passes through the center of mass of the Oldham coupling 70, and is always parallel to Plane F. As shown and described later, Plane C is not always aligned to Plane A.

The center of mass 450 of the Oldham coupling 70 has coordinates of $x(\Theta)$ and $y(\Theta)$, with respect to the driver scroll axis 96, which is also the center of the compressor. Accordingly, as the scroll set makes an orbit, the center of mass of the Oldham coupling 450 is defined by x, y, and $\Theta$. Mathematically, when the scroll set orbits one revolution, the Oldham coupling 70 center mass will orbit two revolutions and this can be problematic. The following equations EQ1 and EQ2 calculate the x, y coordinates, through the rotation of 0 to $\pi$.

$$x(\Theta)=R^{*}\cos(\Theta)^{*}\cos(\Theta) \qquad \text{EQ1}$$

$$y(\Theta)=-R^{*}\sin(\Theta)^{*}\cos(\Theta) \qquad \text{EQ2}$$

R represents a distance between the driver scroll axis 96 and the idler scroll axis 98 (which is essentially the orbit radius (Ror) of the involute pair) and $0 \leq \Theta \leq \pi$. For the purpose of calculation, Plane C passes through the center of mass 450, is parallel to Plane A and perpendicular to Plane B. Also for calculations, a distance D is parallel to the Plane A, and is the variable offset from the driver scroll axis 96. In the initial design, the Oldham coupling 70 is symmetric, and D=0. The X axis is stationary, and passes through the driver axis 96 and idler axis 98. The Y axis originates at the driver scroll axis 96, and is perpendicular to the X axis. These may be used for the calculations involving the optimization of the Oldham coupling center of mass 450, which may be a variable offset D between the stationary Plane F axis and the variable Plane C axis. The $\Theta$ angle originates from the X axis and moves in a clockwise direction. Accordingly, one objective is to optimize the design, such that the center of mass of the Oldham coupling 450 is equal to the geometric center of the Oldham coupling 70. If D>0, the equations for the center mass of the Oldham coupling 450 are as follows:

$$x(\Theta)=D^{*}\sin(\Theta)+R^{*}\cos(\Theta)^{*}\cos(\Theta) \qquad \text{EQ3}$$

$$y(\Theta)=D^{*}\cos(\Theta)-R^{*}\sin(\Theta)^{*}\cos(\Theta) \qquad \text{EQ4}$$

For EQ3 and EQ4, $0 \leq \Theta \leq 2\pi$.

Figure 6:
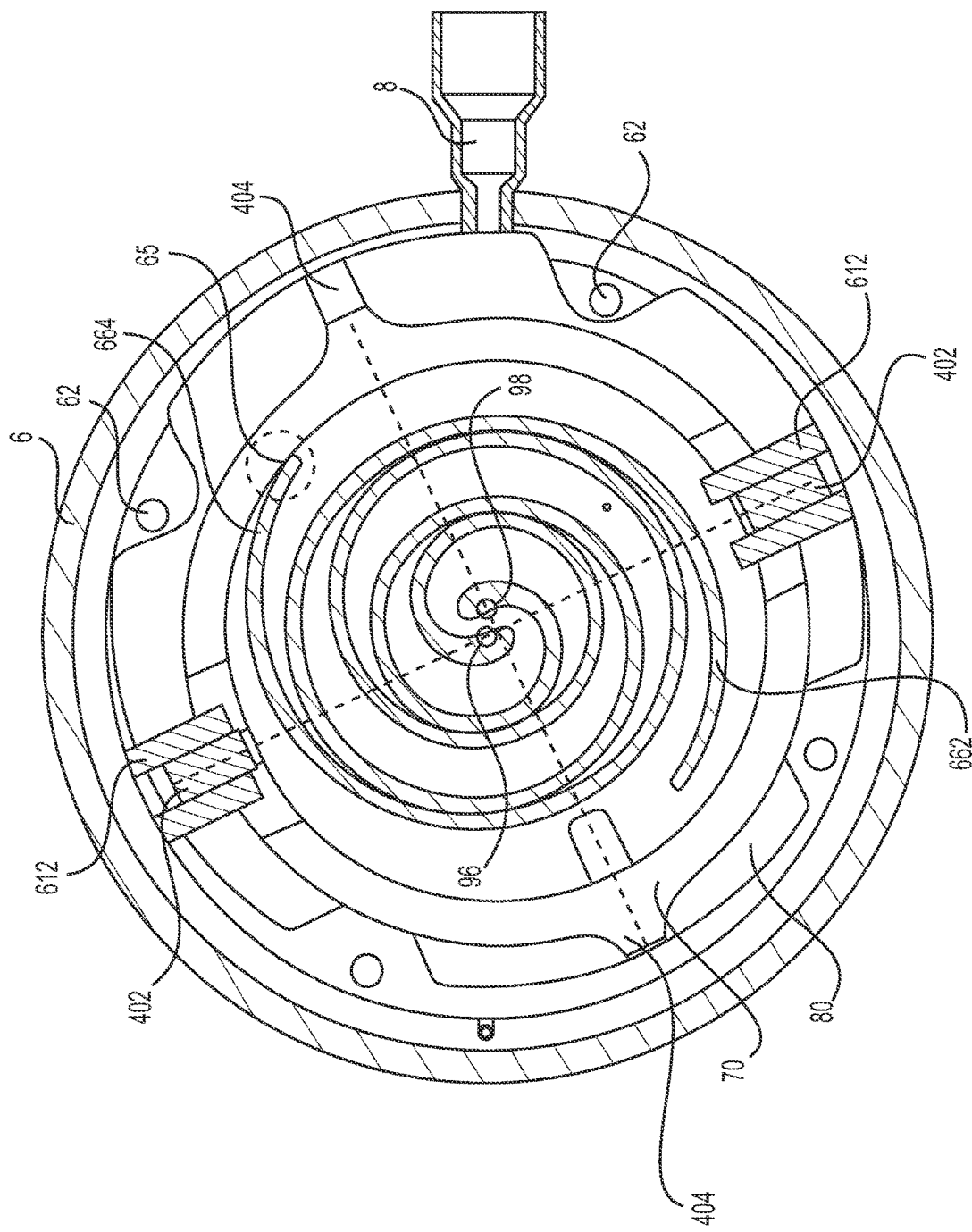
FIG. 6 illustrates an example of a top view of a lower portion of a compressor according to some implementations.

FIG. 6 illustrates an example of a top view of a lower portion of a compressor according to some implementations. FIG. 6 illustrates a problem with respect to the Oldham coupling 70 colliding with structures between the driver scroll 50 and the idler scroll 80 during a portion of the 360-degree crank angle orbiting motion. Examples of these structures may be sections of the main bearing seat (4, 6), outer sections of the scroll involutes, and the shoulder bolts 62. For example, as illustrated at reference number 65 and shown in a circle, an outer section of the idler scroll involute 664 may contact the inner surface of the Oldham coupling 70. FIG. 6 also shows Oldham coupling key support extensions of the driver scroll 612 engaging with the Oldham coupling driver scroll keys 402.

Figure 7:
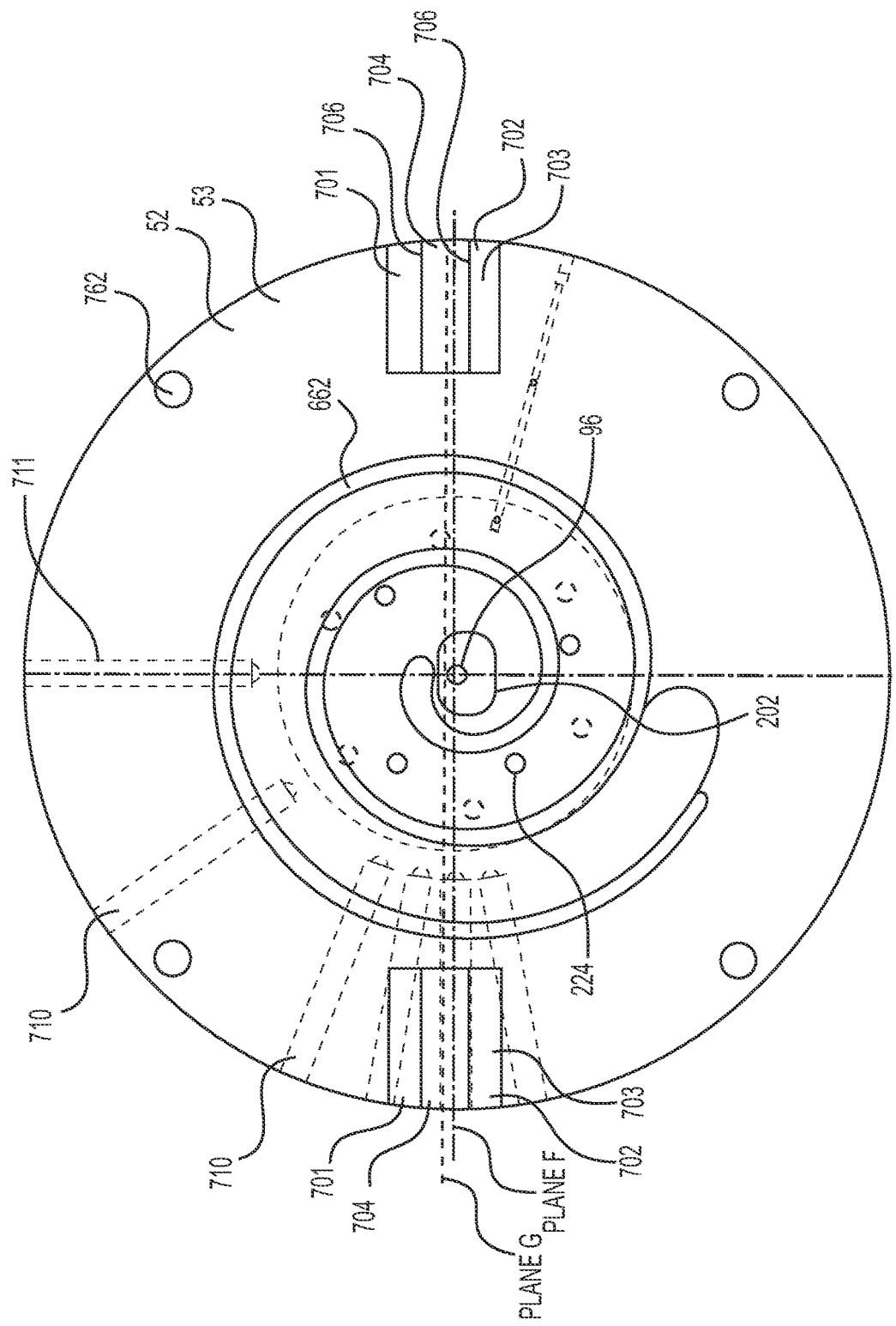
FIG. 7 illustrates an example of a bottom view of a driver scroll according to some implementations.

FIG. 7 illustrates an example of a bottom view of a driver scroll according to some implementations. In some implementations, one or more balance holes 710 may be bored or drilled into the outer diameter of the driver scroll plate 52. As mentioned above, the driver scroll plate 52 has a spiral involute 662 extending downward from the bottom surface 53 of the plate. Additionally, in some examples, two Oldham key support extensions 702 may extend from the bottom or lower surface 53 of the driver scroll plate 52, which as mentioned above, may include an Oldham key slot 704, which may have a floor section or surface that is lower than the lower surface 53. For example, each key support extension 702 may include two structures (701, 703) that face each other and create the key slot 704 and are symmetrical in size and shape.

In some examples, the key support extensions 702 are shifted or offset by a distance D such that a Plane G (first plane) passing through the center of each Oldham key slot 704 is parallel and shifted or offset with respect to Plane F, which is through the driver scroll axis 96. As mentioned above, each key slot 704 may have two side surfaces 706 which may be flat and parallel to one another. Accordingly, Plane G may be parallel to each side surface 706 and may extend halfway between each side and through the center of each key slot 704. An example of the distance D (shown in FIG. 9) in this instance may depend on the size of the scroll compressor and may be about the width of an Oldham coupling key.

Figure 8:
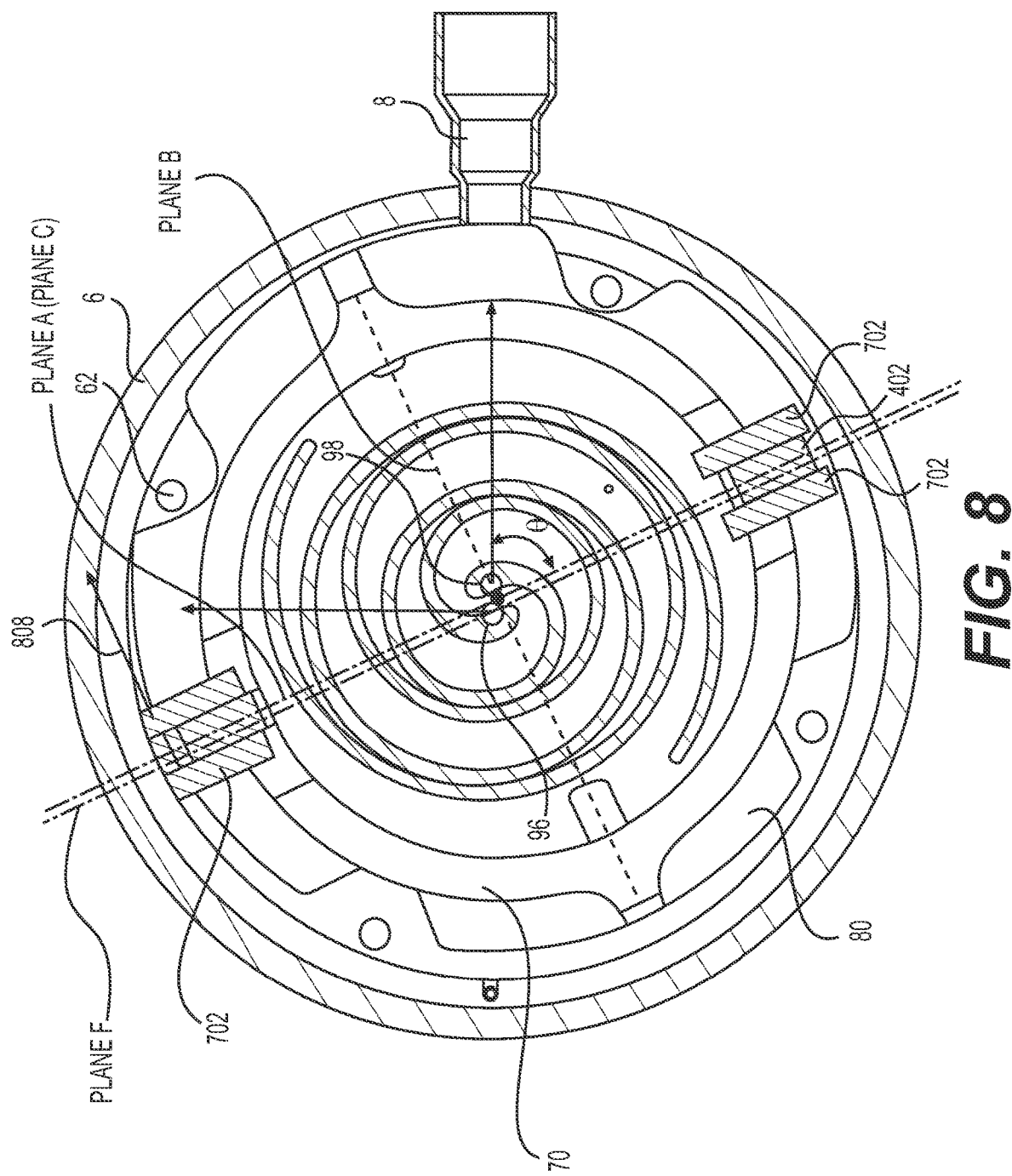
FIG. 8 illustrates an example of a top view of a lower portion of a compressor according to some implementations.

FIG. 8 illustrates an example of a top view of a lower portion of a compressor according to some implementations. In some implementations, as the offset Oldham coupling key support extensions 702 of the driver scroll 50 engages with the driver scroll keys 402 of the Oldham coupling 70, the Oldham coupling 70 is shifted, as illustrated, by the distance between Plane F and Plane A and the arrow 808. As shown, Plane F is through the driver scroll axis 96 and Plane A is through the center of the driver scroll keys 402 of the Oldham coupling 70. Further, in this instance, the shift of the key support extensions 702 of the driver scroll 50 effectively moves the Oldham coupling 70 to a point that the interference identified by reference numeral 65 in FIG. 6 will be eliminated. Additionally, Plane C through the center of mass of the Oldham coupling 450 is shifted along Plane B. One or more radial holes 710 in the base plate 52 on the opposite side of the end angle of the involute may be disposed to correct a balance issue in the Driver scroll 52.

Figure 9:
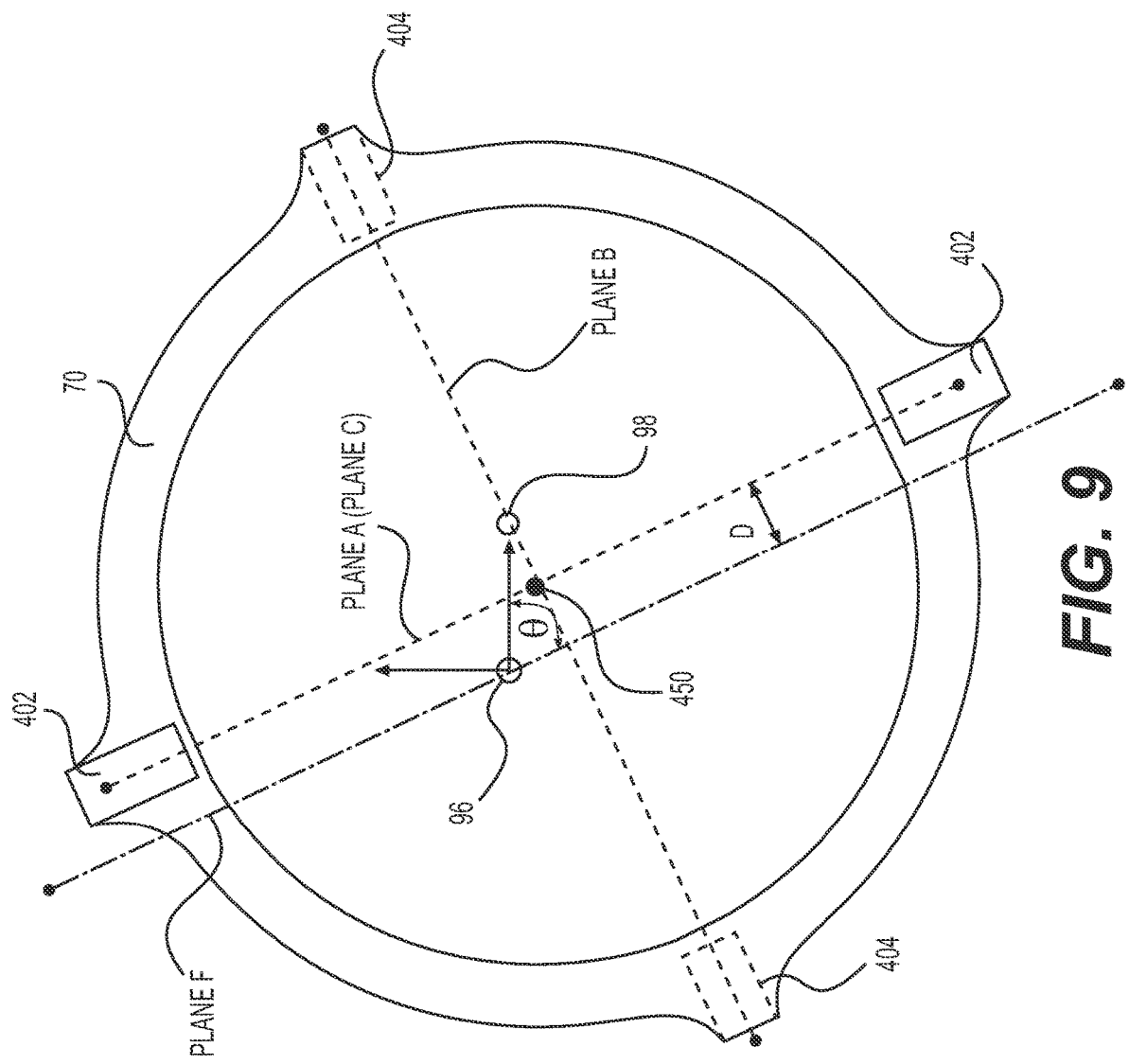
FIG. 9 illustrates an example of a mathematical representation of the Oldham coupling in FIG. 8 according to some implementations.

FIG. 9 illustrates an example of a mathematical representation of the Oldham coupling in FIG. 8 according to some implementations. As shown, Planes A and C have moved away from Plane F; whereas Plane B has not changed. The Oldham center of mass 450 remains on Plane B, but has moved the distance D from Plane F, which passes through the driver axis 96. In other words, as the shifted or offset key support extensions 702 of the driver scroll 52 engage with the driver scroll keys 402, the driver scroll keys 402 also shift, which shifts the center of mass of the Oldham coupling 450 relative to Plane F, as illustrated in Plane C. Accordingly, the Oldham coupling center of mass 450 rotates around the driver scroll axis 96, as the compressor is operating. Therefore, the X-Y coordinates are now a function of D, as defined in equations EQ3 and EQ4.

With respect to balance, If the distance D has any positive value, the center of mass of the Oldham coupling 450 becomes a problem. When D=0, the trajectory of the center of mass is essentially a pure circle during operation. The other examples of D>0, are expressed as a function of the orbit radius R. If D<R, the orbit path becomes a limacon. This example clearly shows that for each revolution of the compressor mechanism, the Oldham center of mass 450 rotates twice. An erratic motion would cause a significant increase in sound, vibration, and likely reliability. If, for example, D=3R the motion is a dimpled limacon, and it indicates that the motion of the Oldham center of mass 450 approaches a circle as D approaches infinity.

Figure 10:
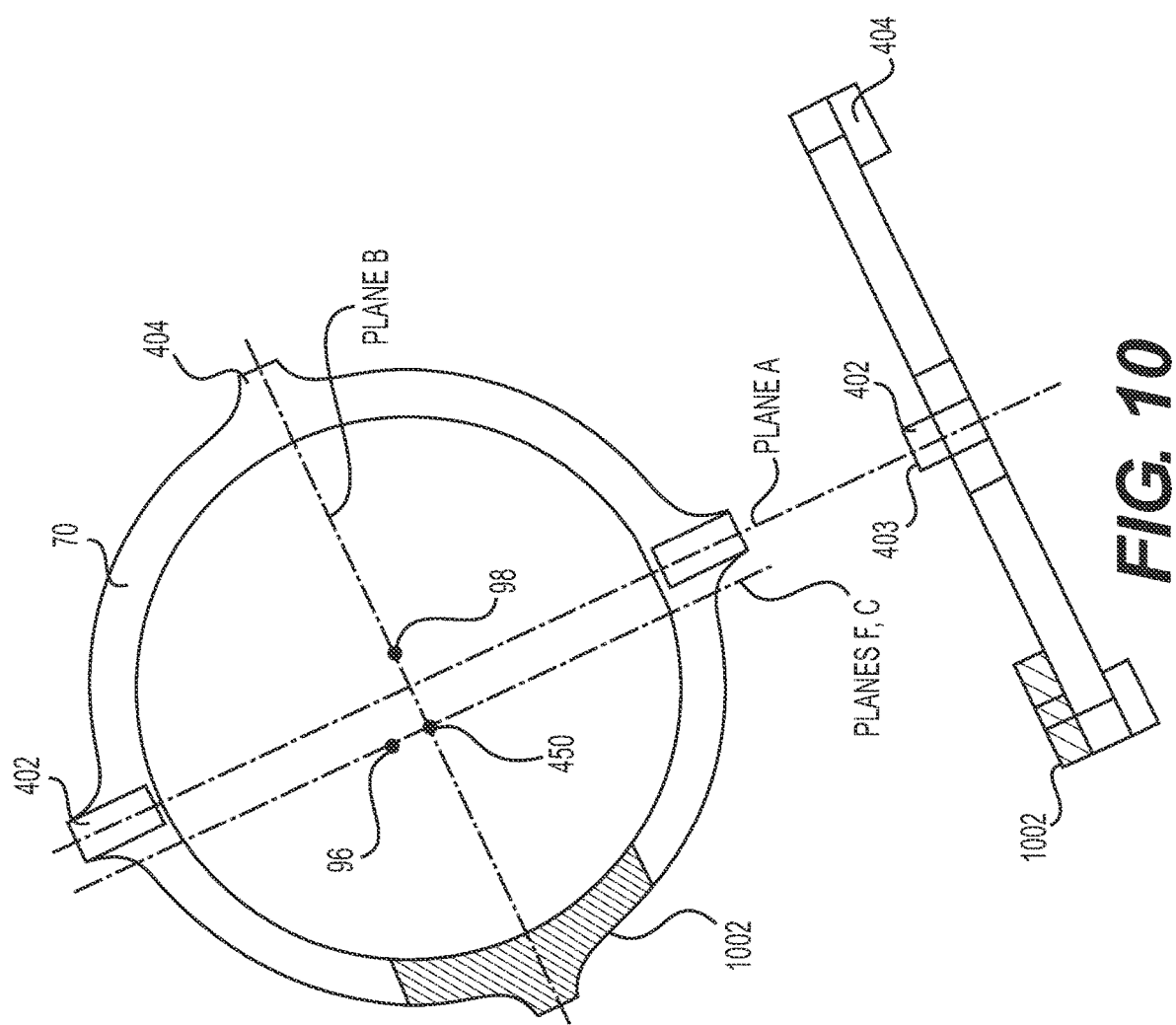
FIG. 10 illustrates an example of a top view and a perspective view of an Oldham coupling according to some implementations.

FIG. 10 illustrates an example of a top view and a perspective view of an Oldham coupling according to some implementations. In an implementation where the key extensions 702 extending off the driver scroll 50 are shifted (such as shown in FIGS. 7 and 8), material 1002 may be added to a portion of the Oldham coupling 70 on the opposite side of the Plane A driver key slot 704 offset. In this case, the material 1002 is added in the axial direction around a portion of the Oldham coupling 70 that may include the top surface portion of the idler scroll key 404. The material 1002 added may be uniform in height around a portion of the Oldham coupling 70 and may be lower than a top surface 405 of the driver scroll key 402. Further, the mass of material 1002 added should be equal on either side of Plane B, which may bisect the idler scroll keys 404. As shown in FIG. 10, as a result of adding the material 1002, the center of mass of the Oldham coupling 450 returns to Plane F across the driver axis 96 from where the center of mass 450 was shifted as shown in FIG. 9, and its motion is essentially a circle during operation. The composition of the added material may be the same as the material of the Oldham coupling, which may be a die cast aluminum.

Figure 11:
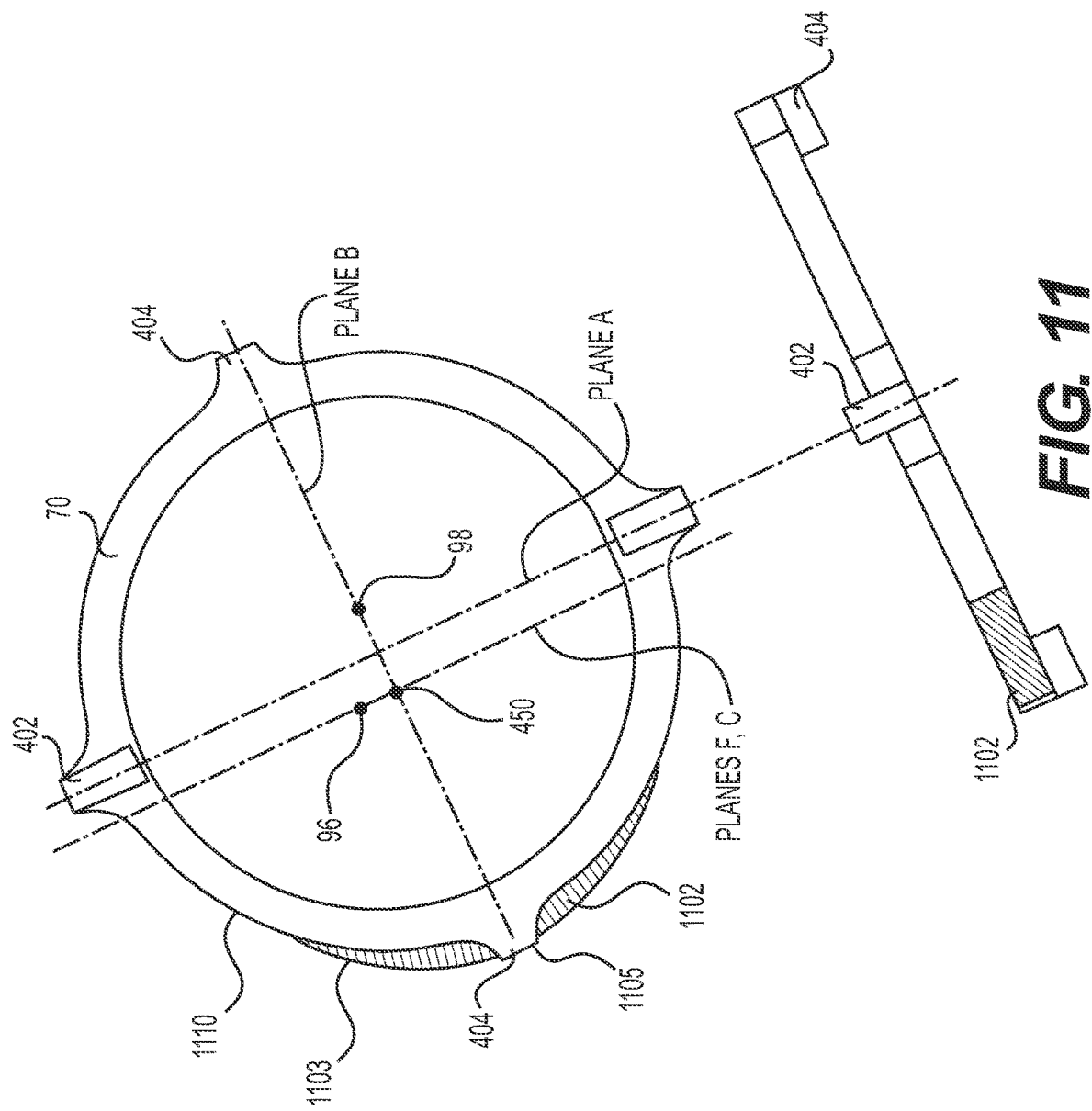
FIG. 11 illustrates an example of a top view and a perspective view of an Oldham coupling according to some implementations.

FIG. 11 illustrates an example of a top view and a perspective view of an Oldham coupling according to some implementations. In an implementation where the key extensions 702 extending off the driver scroll 50 are shifted (such as shown in FIGS. 7 and 8), material 1102 may be added in the radial direction to a portion of the Oldham coupling 70 around a portion of an outer surface 1110 of the Oldham coupling 70. The added material 1102 may maintain a corresponding curvature of the outer surface 1110 that it is being added to and it may extend in the radial direction off the outer surface 1110 less than the outer surface 1105 of the idler scroll key 404. Further, the mass of material 1102 added should be equal on either side of Plane B. As a result of adding the material, the center of mass of the Oldham coupling 450 returns to Plane F across the driver axis 96 from where the center of mass 450 was shifted as shown in FIG. 9, and its motion is essentially a circle during operation. The composition of the added material may be die cast aluminum.

Returning to FIG. 7, which shows the driver scroll 50 and the key support extensions 702, one or more balance holes 710 may be disposed into the driver scroll plate 52 for balance. For example, since the key slots 704 and the key support extensions 702 are shifted in the driver scroll 50, the driver scroll 50 may be unbalanced. The imbalance should be corrected, especially for operation at high speeds. One or more balance holes may correct the balance. A balance hole disposed perpendicular to Planes F, A, and C, such as balance hole 711, may be disposed. For instance, the removal of mass of the driver plate 52 by the balance hole 711 may correct an imbalance of the driver scroll 50 that may be caused by shifting or offsetting the support extensions 702, as shown in FIGS. 7 and 8, for example. In some examples, 5 or 6 balance holes in total may be disposed.

Figure 12:
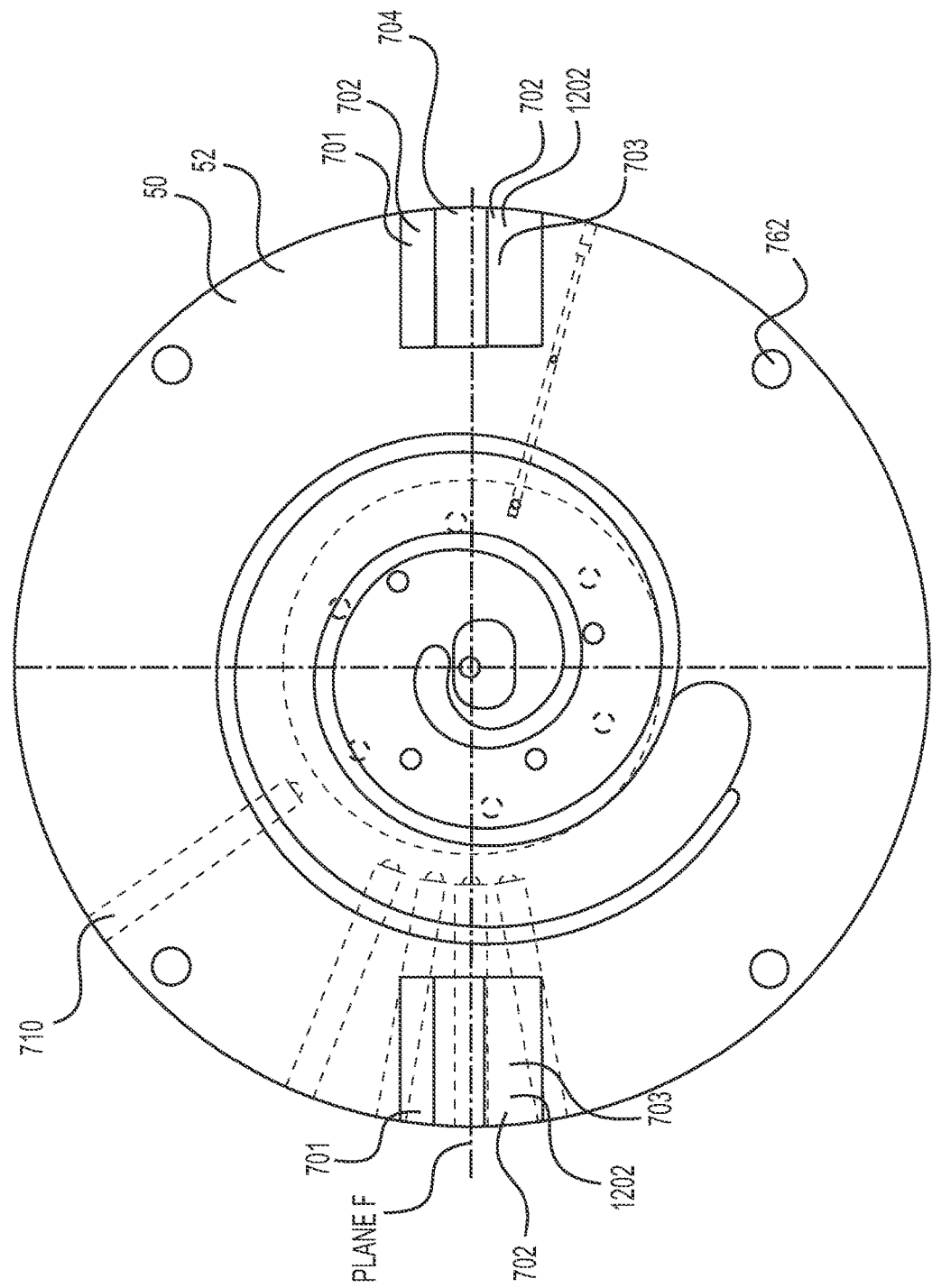
FIG. 12 illustrates an example of a bottom view of a driver scroll according to some implementations.

FIG. 12 illustrates an example of a bottom view of a driver scroll according to some implementations. For example, since the key slots 704 and the key support extensions 702 are shifted in the driver scroll 50, the driver scroll 50 may be unbalanced. The imbalance should be corrected, especially for operation at high speeds. As mentioned above with respect to FIG. 7, two Oldham key support extensions 702 may extend from the bottom or lower surface 53 of the driver scroll plate 52, which as mentioned above, may include an Oldham key slot 704, which may have a floor section or surface that is lower than the lower surface 53. For example, each key support extension 702 may include two structures (701, 703) that face each other and create the key slot 704 and are symmetrical in size and shape (as shown in FIG. 7). As shown in FIG. 12, to correct an imbalance in the driver scroll 50 as a result of shifting or offsetting the key support extensions 702 (and key slots 704), material 1202 may be added to one of the two support structures 701, 703 of the key support extensions 702. In FIG. 12, for example, material 1202 is added to support structure 703 on both key support extensions 702. In some instances, the support structure 703 of each key support extension 702 may be bigger or wider in a direction parallel to Plane B thereby realizing the added mass of the material. The material may be added to the support 701, 703 that is opposite to the direction of the shift of the support extensions 702. For example, if the key support extensions 702 are shifted to one side of Plane F, the material may be added to the structure (e.g., 703) that is opposite to the direction of the shift. The mass of the added material may depend on the required imbalance correction. The composition of the added material may be the same as the material of the support extensions 702 themselves, generally a cast iron or ductile iron.

Figure 13:
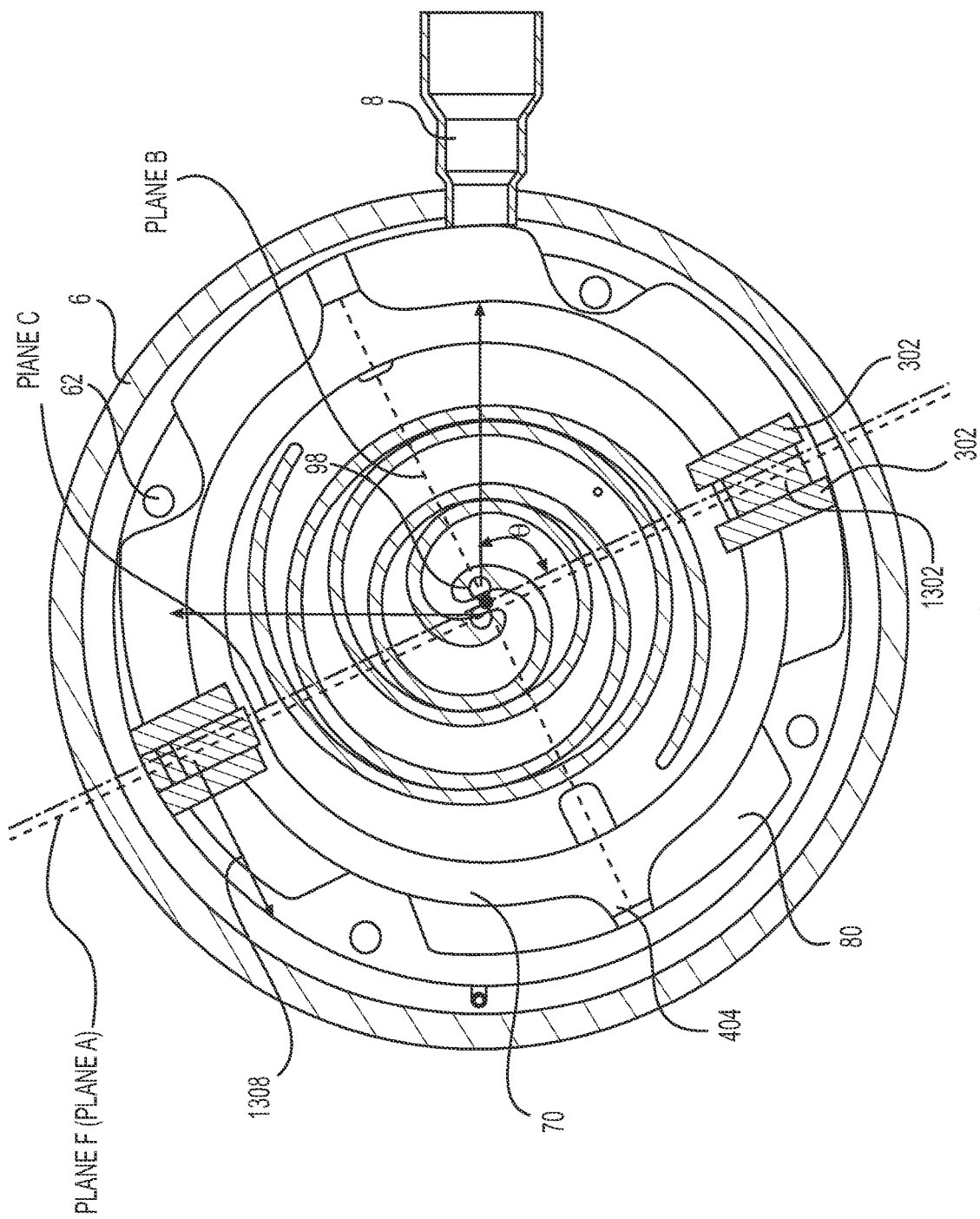
FIG. 13 illustrates an example of a top view of a lower portion of a compressor according to some implementations.

FIG. 13 illustrates an example of a top view of a lower portion of a compressor according to some implementations. As shown, the driver scroll keys 1302 of the Oldham coupling 70 are shifted such that Plane F and Plane A are coincident and the shift of the driver scroll keys 1302 of the Oldham coupling 70 causes the plane through the center of mass of the Oldham coupling Plane C to shift a distance D (shown in FIG. 14). In FIG. 13, the shift is indicated by an arrow 1308. In this instance the Oldham coupling support extensions 302 are not shifted and therefore the key slots 310 are not shifted and the center of the key slots 310 are in the same plane as the driver axis 96 (Plane F). In other words, the driver scroll keys 1302 are shifted by an increment D (shown in FIG. 14) compared to driver scroll keys 402 of the Oldham coupling 70 shown in FIGS. 1-5, for example. An example of the distance D may be 0.5 R. Further, the difference may determined based on the interference. As a result, the section of the Oldham coupling 70 where the interference was (e.g., 65 in FIG. 6) has now been shifted and the interference does not occur during operation.

Figure 14:
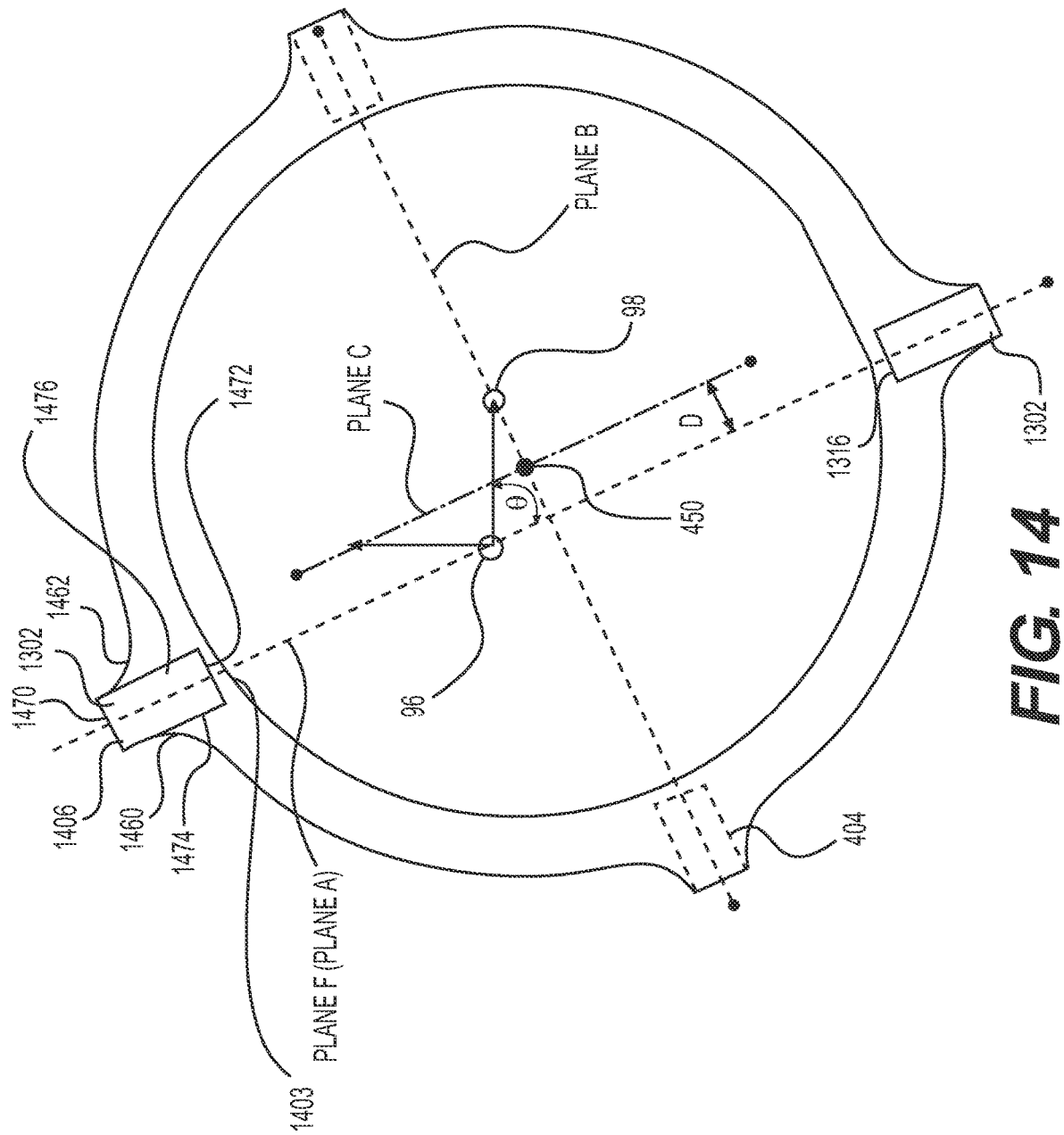
FIG. 14 illustrates an example of the Oldham coupling in FIG. 13 according to some implementations.

FIG. 14 illustrates an example of a mathematical representation of the Oldham coupling in FIG. 13 according to some implementations. FIG. 14 also shows the driver keys 1302 shifted. As shown, plane A (which is through the center of the driver keys 1302 or bisects the driver keys 1302) is parallel to Place C and perpendicular to plane B and offset by a distance D. That is, in some implementations, upon engagement of the driver scroll and the Oldham coupling 70, Plane C, which is through the Oldham coupling center of mass 450, is shifted by a distance D as a result of offsetting or shifting the driver scroll keys 1302. The shifted center mass 450 is essentially the intersection of Plane C and Plane B.

Further, the curved portion 1460 of the outer surface of the Oldham coupling 70 may not be symmetrical or the same to the curved portion 1462 in slope and shape. Further, the raised or elevated portion 1406 of the driver scroll key 1302 may have a rectangular prism or cuboid shape with an inward facing surface 1472 parallel to an outward facing surface 1470. Side surfaces 1474, 1476 of the elevated portion 1406 may be flat and parallel to one another. Additionally, in some instances, a plane coincident with the inner surface 1472 may not be parallel with a tangential plane of a curved portion 1403 of the inside surface of the Oldham coupling 70. Of course, as mentioned, the shape of the raised or elevated portion 1406 will correspond to the key slot 310 formed in part by the support extensions 302.

Figure 15:
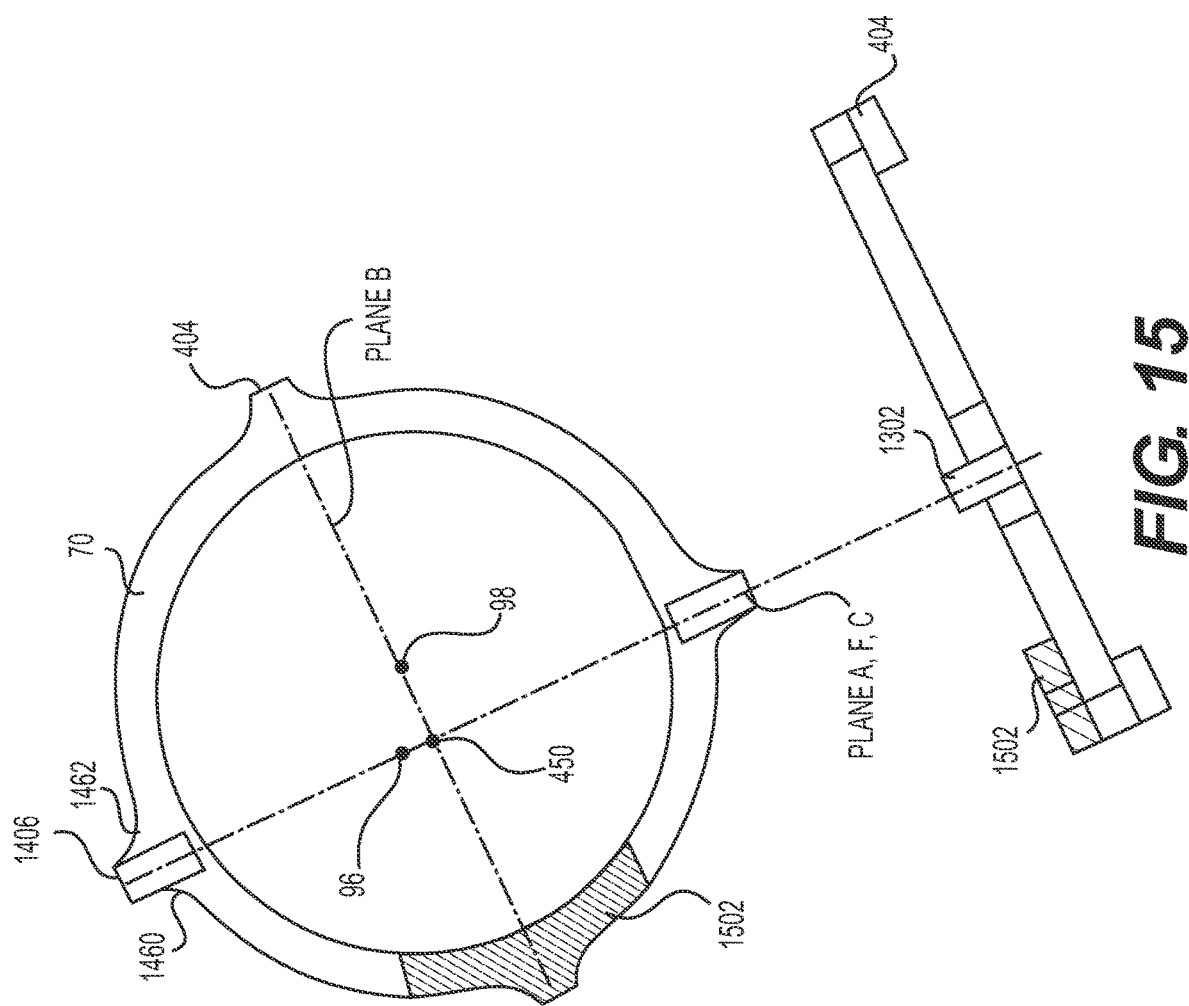
FIG. 15 illustrates an example of a top view and a perspective view of an Oldham coupling according to some implementations.

FIG. 15 illustrates an example of a top view and a perspective view of an Oldham coupling according to some implementations. In an instance where the driver scroll keys 1302 are shifted or offset (as shown in FIGS. 13 and 14, for example) material 1502 may be added to a portion of the Oldham coupling 70 to a same side that the driver scroll keys 1302 are shifted or offset. In this case, the material 1502 is added in the axial direction around a portion of the Oldham coupling 70. The added material 1502 causes Plane C, which is the plane through center of mass of the Oldham coupling 450 to be coincident with Planes A and F and therefore corrects an imbalance. The material 1502 added may be uniform in height around a portion of the Oldham coupling 70 and may be lower than a top surface 1305 of the driver scroll key 1302. Further, the mass of material 1502 added should be equal on either side of Plane B. In other words, as a result of adding the material 1502, the plane of center of mass 450 Plane C returns to the plane through driver axis 96, and its motion is a circle during operation. The composition of the added material 1502 may be the same as the Oldham coupling, generally a die cast aluminum.

Figure 16:
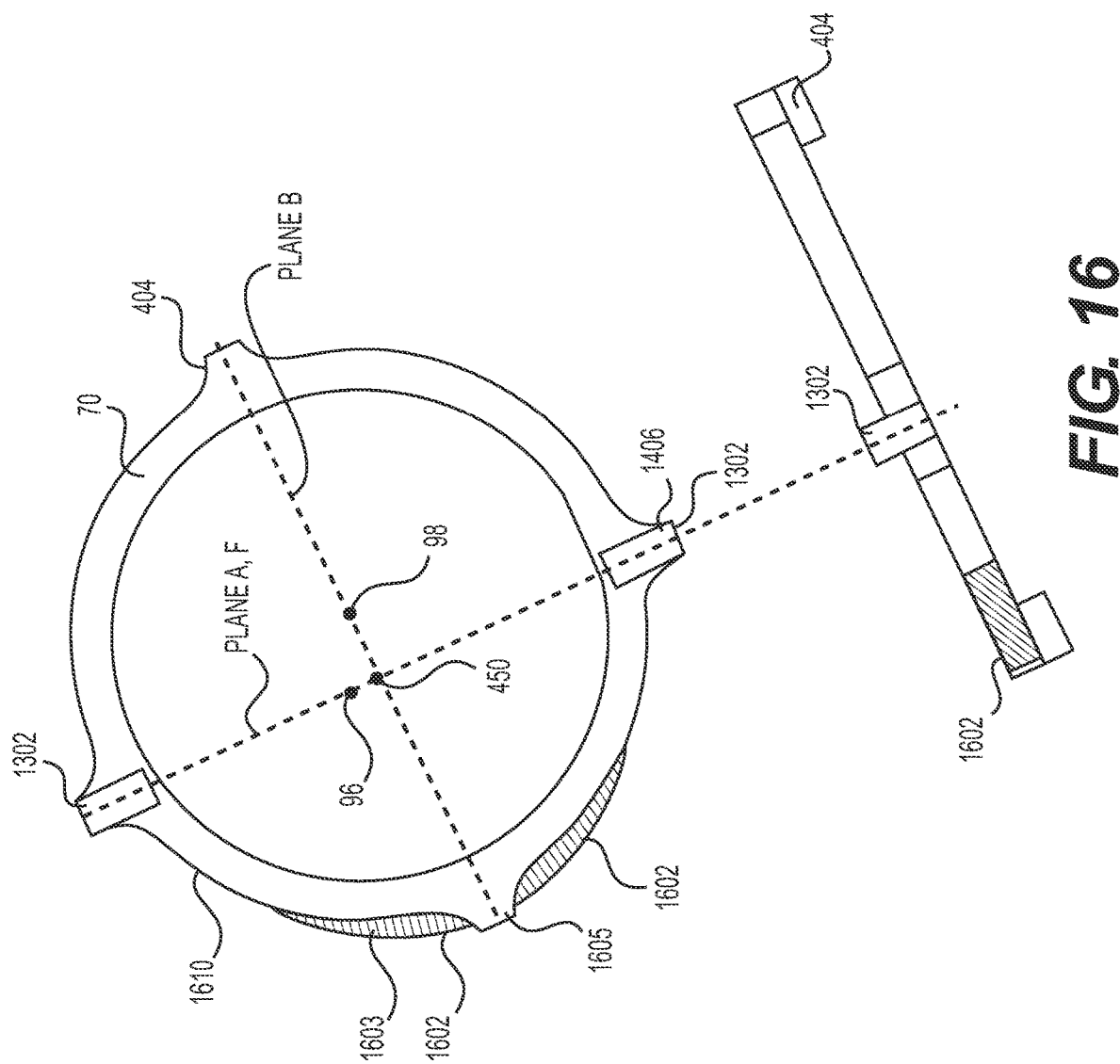
FIG. 16 illustrates an example of top view and a perspective view of an Oldham coupling according to some implementations.

FIG. 16 illustrates an example of top view and a perspective view of an Oldham coupling according to some implementations. In an instance where the driver scroll keys 1302 are shifted or offset (as shown in FIGS. 13 and 14, for example) material 1602 may be added in the radial direction to a portion of the Oldham coupling 70 around a portion of an outer surface 1610 of the Oldham coupling 70. The added material 1502 causes Plane C, which is the plane through center of mass of the Oldham coupling 450 to be coincident with Planes A and F and therefore corrects an imbalance. The added material 1602 may maintain a corresponding curvature of the outer surface 1610 that it is being added to and it may extend in the radial direction off the outer surface 1610 less in the radial direction than the outer surface 1605 of the idler scroll key 404. Further, the mass of material 1602 added should be equal on either side of Plane B. In other words, as a result of adding the material, the plane through center of mass 450 Plane C returns to the plane through the driver axis 96, and its motion is a circle during operation. The composition of the added material 1502 may be the same as the Oldham coupling, generally a die cast aluminum.

Figure 17:
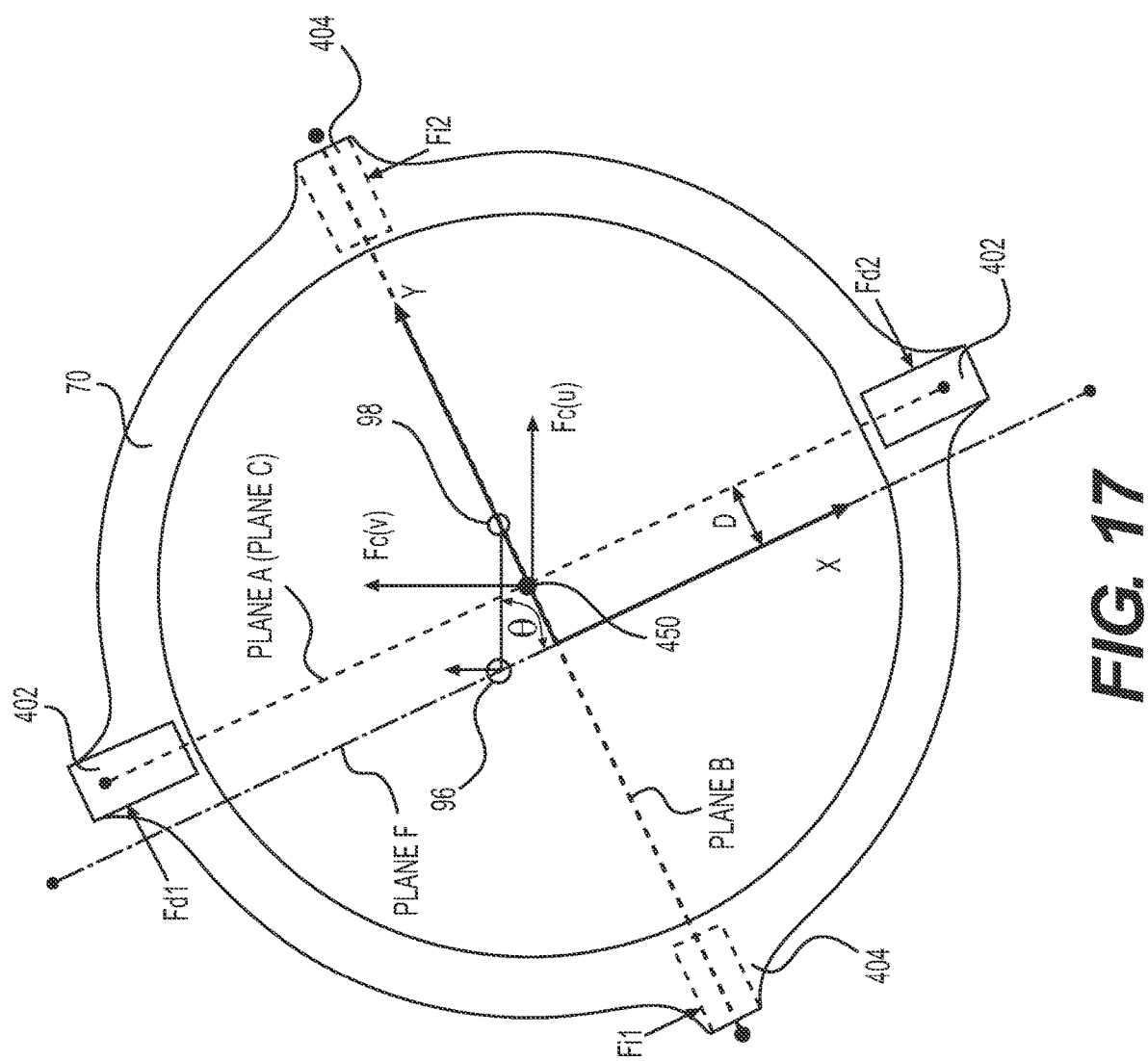
FIG. 17 illustrates an example of a mathematical representation of the Oldham coupling in FIG. 8 according to some implementations.

FIG. 17 illustrates an example of a mathematical representation of the Oldham coupling in FIG. 8 according to some implementations. For example, FIG. 17 relates to an instance where the key extensions 702 extending off the driver scroll 50 are shifted (as shown in FIGS. 7 and 8, for example). The following descriptions explain the technical problems that may occur if the Oldham center of mass 450 is not maintained on Plane F, which is across the driver axis 96. As shown, the X axis is aligned with Plane F, and the Y axis is aligned with Plane B. As the driver scroll rotates, this produces a rotating force of Fd1 and Fd2 on the Oldham coupling driver scroll keys 402 engaged with the driver scroll 50. As previously described, the Oldham coupling 70 then moves the idler scroll 80 into synchronous rotation by the Fi1 and Fi2 idler key 404 forces. Finally, the centrifugal force of the Oldham is distributed by components on the X and Y axis. The following symbols are defined: Fd1=operating force on a first driver scroll key 402; Fd2=operating force on a second driver scroll key 402; Fi1=operating force on a first idler scroll key 404; Fi2=operating force on a second idler scroll key 404; Fc(u)=centrifugal force on Oldham coupling in u axis; and Fc(v)=centrifugal force on Oldham coupling in v axis.

Figure 18:
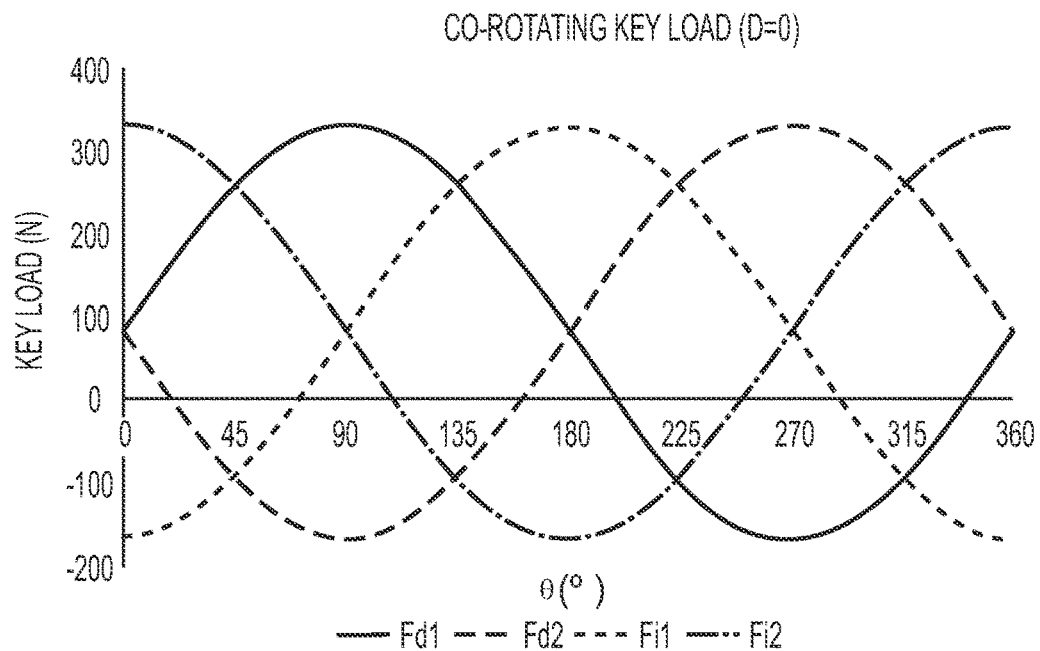
FIG. 18 illustrates an example co-rotating scroll analysis according to some implementations.

FIG. 18 illustrates an example co-rotating scroll analysis according to some implementations. The following analysis is the co-rotating scroll Oldham coupling at the following operating conditions: compression torque=10 kN*mm; distance between Oldham keys=120 mm; mass of the Oldham coupling=0.08 kg; and the rotational speed of the compressor=140 rps. In particular, the force dynamics for each 360 degree orbit is explained.

For example, FIG. 18 shows a 360 degree rotation of the Oldham coupling 70, with the offset value of D=0, in which the Oldham coupling center mass orbits in essentially a pure circular path. In addition, the forces on the two driver keys 402 and two idler keys 404 are plotted. As expected, the forces on each pair keys are in the opposite directions, as shown in the explanation of FIG. 17. The forces also cycle symmetrically between positive and negative, with a constant peak-to-peak of 495 N and an average force of 83 N. Therefore, the Oldham coupling 70 is constantly switching direction, between CW and CCW rotation.

Figure 19:
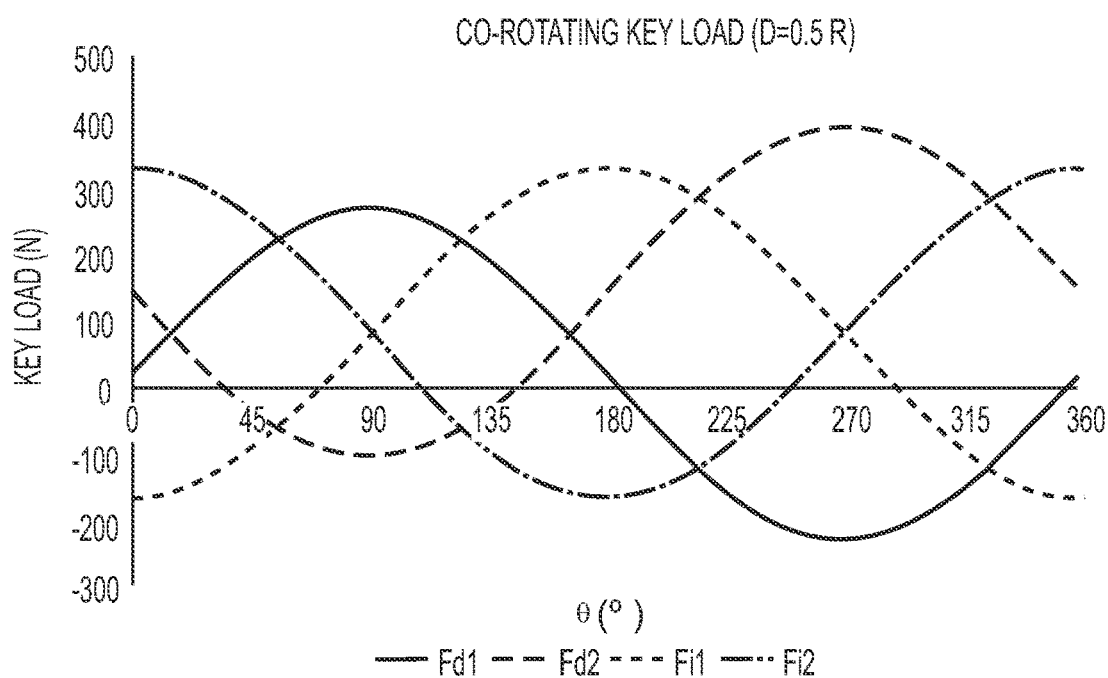
FIG. 19 illustrates an example of a co-rotating scroll analysis according to some implementations.

FIG. 19 illustrates an example of a co-rotating scroll analysis according to some implementations. In the analysis shown in FIG. 19, the offset D=0.5R; and therefore an unbalanced Oldham coupling 70. In this instance, we can conclude that the load of idler keys 404 remains the same, regardless of the value of D. Whereas the load of the driver keys 402 continue increasing as D increases. As in FIG. 18, the forces also cycle symmetrically between positive and negative, but the peak to peak is no longer constant. Although the average force is the same, in this case the primary peak-to-peak is 375 N, but the secondary is 620 N. This very cyclic load, within each orbit of the scroll compression chambers, is a major effect is on the involute wall contact; and therefore a high source of sound. Since the radial compliant co-rotating scroll concept has potential to operate at much higher speeds than conventional scroll compressors (that use a fixed and an orbiting scroll, for example), the value of balancing the Oldham coupling 70 is significant.

The imbalance of the Oldham coupling 70 that is discussed above and that occurs due to an instance where the key extensions 702 extending off the driver scroll 50 are shifted (as shown in FIGS. 7 and 8) or due to an instance where the driver scroll keys 1302 are shifted or offset (as shown in FIGS. 13 and 14, for example) is a very important issue in co-rotating scrolls, such as the co-rotating scrolls discussed herein, especially during high speed operation (e.g., >200 hz or 12,000 RPM). An objective of these implementations is to avoid interference between the Oldham coupling 70 and other structures (e.g., sections of the main bearing seat, outer sections of the scroll involutes, and the shoulder bolts 62). However, an imbalance may occur that results in the center of mass of the Oldham coupling 450 to be off of the geometric center. The importance is of addressing the imbalance becomes greater in co-rotating scroll applications than in compressors implementing a fixed and orbiting scroll set, for example. Compressors that implement a fixed scroll and an orbiting scroll with an Oldham coupling 70 disposed directly between are operated at fixed or moderate operation speeds (e.g., 60-150 hz or 3600-9000 RPM). Accordingly, in conventional fixed and orbiting scroll sets, addressing the imbalance at higher speed was much less effective.

The processes described herein are only examples for discussion purposes. Numerous other variations will be apparent to those of skill in the art in light of the disclosure herein. Further, while the disclosure herein sets forth several examples of suitable frameworks, architectures and environments for executing the processes, the implementations herein are not limited to the particular examples shown and discussed. Furthermore, this disclosure provides various example implementations, as described and as illustrated in the drawings. However, this disclosure is not limited to the implementations described and illustrated herein, but can extend to other implementations, as would be known or as would become known to those skilled in the art.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The invention claimed is:

1. A compressor, comprising:
   a cylindrical housing;
   a lower cap housing engaging with the cylindrical housing;
   a main shaft disposed along a main axis;
   a driver scroll having a driver axis aligned with the main axis and having a spiral involute extending from a base plate of the driver scroll;
   an idler scroll having an axis offset from the main axis and having a spiral involute intermeshed with the spiral involute of the driver scroll;
   an Oldham coupling disposed between the driver scroll and idler scroll; and
   two key slots extending from the base plate of the driver scroll toward the idler scroll, each key slot respectively engages with a corresponding driver scroll key of the Oldham coupling,
   wherein the driver scroll is configured such that a first plane through a center each of the two key slots is parallel to and offset from a second plane extending through the driver axis of the driver scroll.

2. The compressor of claim 1,
   wherein upon engagement of the driver scroll keys of the Oldham coupling with the corresponding key slots of the driver scroll, a third plane through the center of each driver scroll key coincides with the first plane.

3. The compressor of claim 1,
   wherein the Oldham coupling includes two idler scroll keys, and
   wherein a first portion of the Oldham coupling that includes one of the two idler scroll keys, that is opposite and across from a second portion of the Oldham coupling that includes another of the two idler scroll keys, has a greater mass than the second portion with respect to a fourth plane extending through a center of mass of the Oldham coupling.

4. The compressor of claim 3,
   wherein the first portion has a top surface that is higher, in an axial direction, than a top surface of the second portion.

5. The compressor of claim 3, wherein upon engagement of the driver scroll keys of the Oldham coupling with the corresponding key slots of the driver scroll, the fourth plane through the center of mass of the Oldham coupling that is parallel to the first plane is coincided with the second plane extending through the driver axis.

6. The compressor of claim 1,
   wherein the Oldham coupling has an outer surface facing outward,
   wherein first portions of the outer surface adjacent to and on either side of one of two idler scroll keys extends further in the radial direction than second portions of the outer surface adjacent to and on either side of the other idler scroll key of the Oldham coupling with respect to the fourth plane.

7. The compressor of claim 6,
wherein upon engagement of the driver scroll keys of the Oldham coupling with the corresponding key slots of the driver scroll, the fourth plane through a center of mass of the Oldham coupling that is parallel to the first plane is aligned with the second plane extending through the driver axis.

8. The compressor of claim 1,
wherein a radial hole is disposed in the base plate of the driver scroll in the radial direction from an outer surface of the base plate extending toward the driver axis, and
wherein the radial hole is orthogonal to the first plane.

9. The compressor of claim 1,
wherein two support extensions extend from the base plate of the driver scroll toward the idler scroll and each includes one of the key slots, and
wherein each of the two support extensions includes a first structure and a second structure that face each other, the first structure having more mass than the second structure.

10. A compressor, comprising:
a cylindrical housing;
a lower cap housing engaging with the cylindrical housing;
a main shaft disposed along a main axis;
a driver scroll having a driver axis aligned with the main axis and having a spiral involute extending from a base plate of the driver scroll;
an idler scroll having an axis offset from the main axis and having a spiral involute intermeshed with the spiral involute of the driver scroll;
an Oldham coupling disposed between the driver scroll and idler scroll having two driver scroll keys,
wherein a third plane through each of centers of the two driver scroll keys is parallel to and offset from a fourth plane extending through a center of mass of the Oldham coupling.

11. The compressor of claim 10,
wherein two key slots extend from the base plate of the driver scroll toward the idler scroll, each key slot is configured to respectively engage with the corresponding driver scroll key of the Oldham coupling,
wherein upon engagement of the driver scroll keys of the Oldham coupling with corresponding key slots of the driver scroll, the third first plane aligns with a first plane through the center of the key slots of the driver scroll.

12. The compressor of claim 10, wherein the Oldham coupling includes two idler scroll keys, and wherein a first portion of the Oldham coupling that includes one of the two idler scroll keys, that is opposite and across from a second portion of the Oldham coupling that includes another of the two idler scroll keys has a greater mass than the second portion with respect to the fourth plane extending through the center of mass of the Oldham coupling.

13. The compressor of claim 12,
wherein a top surface of the first portion is higher, in an axial direction, than a top surface of the second portion.

14. The compressor of claim 12, wherein upon engagement of the driver scroll keys of the Oldham coupling with the corresponding key slots of the driver scroll, the fourth plane through the center of mass of the Oldham coupling is coincided with a second plane extending through the driver axis of the driver scroll.

15. The compressor of claim 10,
wherein the Oldham coupling has an outer surface facing outward,
wherein first portions of the outer surface adjacent to and on either side of one of two idler scroll keys extends further in the radial direction than second portions of the outer surface adjacent to and on either side of the other idler scroll key of the Oldham coupling.

16. The compressor of claim 15, wherein upon engagement of the driver scroll keys of the Oldham coupling with the corresponding key slots of the driver scroll, the fourth plane through the center of mass of the Oldham coupling is aligned with a second plane extending through the driver axis of the driver scroll.

17. A driver scroll of a scroll compressor, comprising:
a spiral involute extending from a base plate of the driver scroll and having a driver axis; and
two key slots extending from the base plate of the driver scroll, each key slot is configured to respectively engage with a corresponding driver scroll key of the Oldham coupling,
wherein a first plane through each of centers of the two key slots is parallel to and offset from a second plane extending through the driver axis of the driver scroll.

* * * * *